United States Patent
Jeong et al.

(10) Patent No.: US 12,484,333 B2
(45) Date of Patent: Nov. 25, 2025

(54) SHINGLED SOLAR CELL PANEL AND METHOD OF MANUFACTURING THE SAME

(71) Applicant: KOREA INSTITUTE OF INDUSTRIAL TECHNOLOGY, Cheonan (KR)

(72) Inventors: Chae Hwan Jeong, Gwangju (KR); Hong Sub Jee, Gwangju (KR)

(73) Assignee: KOREA INSTITUTE OF INDUSTRIAL TECHNOLOGY, Cheonan (KR)

( * ) Notice: Subject to any disclaimer, the term of this patent is extended or adjusted under 35 U.S.C. 154(b) by 555 days.

(21) Appl. No.: 17/631,166

(22) PCT Filed: Nov. 18, 2019

(86) PCT No.: PCT/KR2019/015749
§ 371 (c)(1),
(2) Date: Jan. 28, 2022

(87) PCT Pub. No.: WO2021/020657
PCT Pub. Date: Feb. 4, 2021

(65) Prior Publication Data
US 2022/0271190 A1    Aug. 25, 2022

(30) Foreign Application Priority Data

Jul. 29, 2019   (KR) .................. 10-2019-0091827
Jul. 30, 2019   (KR) .................. 10-2019-0092206
Jul. 30, 2019   (KR) .................. 10-2019-0092209

(51) Int. Cl.
*H01L 31/18*   (2006.01)
*H10F 10/166*  (2025.01)
(Continued)

(52) U.S. Cl.
CPC ......... *H10F 71/137* (2025.01); *H10F 10/166* (2025.01); *H10F 19/902* (2025.01);
(Continued)

(58) Field of Classification Search
CPC ............. H01L 31/1876; H01L 31/0201; H01L 31/02013; H01L 31/0504; H01L 31/0747;
(Continued)

(56) References Cited

U.S. PATENT DOCUMENTS 11,094,842 B2 * 8/2021 Bedell .................. H01L 31/074
2005/0263854 A1 * 12/2005 Shelton .................. H10H 20/01
438/460

(Continued)

FOREIGN PATENT DOCUMENTS

KR   10-2014-0105520 A    9/2014
KR      10-1823605 B1     3/2018
KR   10-2019-0009830 A    1/2019

*Primary Examiner* — Jarrett J Stark

(57) ABSTRACT

The present invention relates to a shingled solar cell panel for producing a string in which a plurality of strips are partially overlapped with each other, and for electrically connecting the string and the string, and a method for producing the same, the method comprises providing a wafer made of a HIT in which a plurality of conductive layers are formed on upper and lower portions thereof, respectively, forming an adhesive layer by applying a conductive adhesive on the upper conductive layer, dividing the wafer on which the adhesive layer is formed into a plurality of strips, forming a string by overlapping a lower conductive layer of another strip on an area where an adhesive layer is provided among the divided strips. Accordingly, the upper conductive layer and the lower conductive layer of each of the plurality of strips can be configured to be electrically bonded via only the adhesive layer to provide a shingled solar cell panel at low cost.

19 Claims, 30 Drawing Sheets

(51) Int. Cl.
*H10F 19/90* (2025.01)
*H10F 71/00* (2025.01)
*H10F 77/00* (2025.01)

(52) U.S. Cl.
CPC ........... *H10F 71/00* (2025.01); *H10F 77/937* (2025.01); *H10F 77/939* (2025.01)

(58) Field of Classification Search
CPC ........... H01L 31/186; H01L 31/022433; H01L 31/042; H01L 31/0508; H01L 21/78
See application file for complete search history.

(56) References Cited

U.S. PATENT DOCUMENTS

| | | | | |
|---|---|---|---|---|
| 2013/0025658 A1* | 1/2013 | Bedell | ................ | H01L 31/1808 |
| | | | | 136/255 |
| 2014/0352777 A1* | 12/2014 | Hachtmann | ......... | H01L 31/1876 |
| | | | | 136/256 |
| 2017/0077343 A1* | 3/2017 | Morad | ................ | H01L 31/0747 |
| 2017/0186897 A1 | 6/2017 | Atchley | | |

\* cited by examiner (a)

(b)

251    253

(a)

(b)

(a)

(b)

SHINGLED SOLAR CELL PANEL AND METHOD OF MANUFACTURING THE SAME

TECHNICAL FIELD

The present invention relates to a shingled solar cell panel and a method of manufacturing the same, and more particularly, to a shingled solar cell panel for manufacturing a string in which a plurality of strips are partially overlapped with each other (shingled structure), and electrically connecting the strings, and a method of manufacturing the same.

BACKGROUND ART

In recent years, the use of fossil fuels as an energy source tends to decrease. For example, it has long been recognized that the use of fossil fuel-based energy options such as oil, coal and natural gas creates gas and that pollution cannot be easily removed from the atmosphere. Not only that, as more fossil fuel-based energy is consumed, more contaminants that have a detrimental effect on adjacent life are released into the atmosphere. Despite these results, fossil fuel-based energy options are still being depleted at a rapid rate, resulting in rising costs of some of these fossil fuel resources, such as oil. Also, because many fossil fuel storage sites are located in politically unstable regions, the supply and cost of fossil fuels have become unpredictable.

To solve this problem, the popularity of solar energy, a form of clean energy, is increasing. In addition, due to advances in semiconductor technology, it has become possible to design a solar module and a solar panel that are more efficient and can achieve greater efficiency. In addition, as materials used to manufacture solar modules and solar panels become relatively inexpensive, they contribute to a reduction in the production cost of solar power generation. According to Wood Mackenzie in 2019, the global solar module market is expected to finally exceed 100 GW, and the size of the solar market is expected to account for 83% of new global demand by 2023. It is the fastest growing in the Mediterranean (Saudi Arabia, Iran, Egypt and Italy).

Such solar power generation is a technology that directly converts unlimited, pollution-free solar energy into electrical energy. The basic principle of solar power generation is that when sunlight is applied to a solar cell composed of a semiconductor PN junction, electrons and hole pairs due to light energy are generated, and an electromotive force is generated by a solar effect in which electrons and holes move and a current flows across the n-layer and the p-layer, so that the current flows to a load connected to the outside.

In addition, the solar cell module has a multi-layered structure to protect the solar cell from the external environment. The solar cell module frame maintains the mechanical strength of the solar cell module, and serves to strongly bond the solar cell and materials stacked on the front and rear portions of the solar cell.

Meanwhile, the solar module is configured by connecting a plurality of strings in series. For example, 4 to 6 strings constitute one solar module, and each of them has an independent solar power generation function. As shown in FIG. 1, for the above-described string, a busbar 20 is manufactured on the lower and upper portions of the divided strip 10, respectively, and the busbar 20 is connected to the ECA 30 to be bonded. Therefore, it is necessary to provide a process for forming a separate electrode, and thus also provide a material necessary for forming the electrode.

An example of such a technique is disclosed in the following patent documents.

In Patent Document 1 (US Patent Publication No. 2018/0019349, published on 2018 Jan. 18), disclosed are a grid-free solar cell for forming a string and a method for manufacturing a string using the same in which an adhesive polymer compound can be used to attach to a grid-free PV structure, and the surface of a solar cell is formed at a desired position by using a high-power laser beam. After scribing to a predetermined depth, an appropriate force is applied to cut the scribed solar cell into a plurality of small cells, and after the formation of the smaller cells, the plurality of smaller cells are connected in series with partially overlapping adjacent smaller cells.

In addition, in Patent Document 2 (U.S. Pat. No. 9,484,484, registered on Nov. 5, 2016), a shingled solar cell module is disclosed that divides a wafer into six equally divided solar cell cells, includes a front metallization pattern including a first busbar disposed adjacent and parallel to a first outer edge of the wafer, and a second busbar (contact pad row) disposed adjacent and parallel to a second outer edge of the wafer, which is parallel to and opposite the first edge of a wafer, a laser scribes scribe lines in each of the divided solar cells with multiple fingers to define a plurality of rectangular regions in the silicon solar cell, and cuts the silicon wafer along the scribe lines parallel to the first and second outer edges of the wafer.

In addition, in Patent Document 3 (International Patent Publication No. WO 2019/016118, published on Jan. 24, 2019), there is disclosed a stable shingled solar cell string and a method of manufacturing the same, wherein at least two solar cells including overlapping regions for forming shingled solar cell strings are provided, wherein an adhesive foil is located on the upper side of one solar cell and on the lower side of the overlapping solar cell, wherein the adhesive foil includes a plurality of metal wires, and wherein this adhesive foil provides mechanical positioning and fixing of the shingled solar cell.

DISCLOSURE

Technical Problem

In the technology disclosed in the above-described patent documents, etc., since the scribe is performed only on the surface by using a high-power laser beam, there is a problem that a defect or burr of the strip occurs in the cut portion in the process of forming the strip, and when dividing the solar cell, the busbar is formed in one direction on the cut surface, and the edge surface is formed to be shorter than the center portion, so there is a disadvantage that as much as the amount of material for forming the busbar will be wasted.

In addition, in the related art disclosed in the above patent documents, etc., the guide function of the scriber along the cutting line is lacking, so precise scribing is required, and since heat treatment is performed for each electrode, there is also a problem that the annealing effect is reduced.

Meanwhile, in the conventional technology as described above, since a ribbon having a width of 2 to 3 mm is applied, a region corresponding to the total area of the ribbon to be attached is shielded, the total output of the solar cell module is lowered, the risk of breakage of the ribbons in the manufacturing process increases, and there is a problem that loss occurs in power flow.

Technical Solution

It is an object of the present invention to solve the above-mentioned problems, and to provide a shingled solar cell panel, which is capable of being electrically connected by applying only a conductive adhesive to a strip when a plurality of solar cell strips partially overlap each other (shingled structure) to form a string, and a method for manufacturing the same.

Another object of the present invention is to provide a shingled solar cell panel capable of forming a shingled solar cell panel by controlling an overlapping section of a strip in case of emergency in addition to a predetermined overlapping interval, and a method of manufacturing the same.

Still another object of the present invention is to provide a shingled solar cell panel that can minimize string spacing to improve the integration of solar cells, minimize the power loss that can occur when connecting strings to strings, have high output, and maximize efficiency, and a method of manufacturing the same.

Another object of the present invention is to provide a shingled solar cell panel that can align the wire direction perpendicular to the fingers in a string and increase the mechanical strength between the string and the string through pre-lamination, and a method of manufacturing the same.

Another object of the present invention is to provide a shingled solar cell panel having an efficient partitioning structure of solar cells, and capable of directly stacking the cells without further work after partitioning the cells into strips, and a method of manufacturing the same.

In order to achieve the above objects, the method for manufacturing a shingled solar cell panel according to the present invention includes the steps of (a) providing a wafer formed of a heterojunction with intrinsic thin layer (HIT) in which a plurality of conductive layers are formed on the upper and lower portions, respectively, (b) forming an adhesive layer by applying a conductive adhesive on the upper conductive layer, (c) dividing the wafer on which the adhesive layer is formed into a plurality of strips, and (d) forming a string by overlapping a lower conductive layer of another strip on an area where an adhesive layer is provided among the divided strips, wherein each of the upper conductive layer and the lower conductive layer of the plurality of strips is electrically bonded via only the adhesive layer.

In addition, in order to achieve the above objects, the method for manufacturing a shingled solar cell panel according to the present invention includes the steps of (a) providing a plurality of solar cells in which a plurality of strips are partially overlapped with each other to form one string, (b) providing a plurality of wire sheets in which a plurality of wires are respectively disposed, (c) mounting the first and the second wire sheets as some of the plurality of wire sheets on upper surfaces of the first and the third strings as some of the plurality of solar cells, (d) mounting a second string as one of the plurality of solar cells on the first and second wire sheets, (e) electrically connecting the first string, the second string and the third string to each other by a plurality of wires respectively provided on the first and the second wire sheets, and (f) fixing a plurality of wires respectively provided on the first and the second wire sheets to the solar cell, wherein the first string, the second string, and the third string are disposed at predetermined intervals.

In addition, in order to achieve the above objects, the method for manufacturing a shingled solar cell panel according to the present invention includes the steps of (a) providing a wafer for a solar cell, (b) providing a plurality of cutting lines on the front and rear portions of the wafer, respectively, (c) providing a plurality of busbars respectively on the front and rear portions of the wafer, and (d) providing a plurality of solar cells by cutting the wafer along the plurality of cutting lines, wherein the busbars are provided as a pair on both sides adjacent to the one cutting line.

Advantageous Effects

As described above, according to the shingled solar cell panel and the manufacturing method thereof according to the present invention, since the busbar is not formed and only the adhesive layer is provided, in addition to the predetermined overlapping interval as necessary, an effect of controlling the overlapping interval of the strip at the time of need to easily form a shingled solar cell can be obtained.

In addition, according the shingled solar cell panel and the method for manufacturing the same according to the present invention, since the process of forming the busbar using an expensive material is omitted, an effect of being able to provide a shingled solar cell module at low cost is also obtained.

In addition, according to the shingled solar cell panel and the method of manufacturing the same according to the present invention, by performing the electrical connection between the string and the string with a wire, contact resistance can be reduced to obtain a high output through minimizing output loss, and the control of the string width can be easily performed to minimize the microcracks that occur in the process of electrically connecting the string to the string, thereby obtaining an effect of improving the manufacturing efficiency of the solar cell panel.

In addition, according to the shingled solar cell panel and the method of manufacturing the same according to the present invention, since a structure in which a plurality of solar cell strings are electrically connected to each other is provided by using a wire, an effect is obtained in which the shading region is reduced by 86% more than a structure to which an existing ribbon wire is applied, and thus the output of the solar cell panel due to an increase in the area of incidence can be improved.

Meanwhile, according to the shingled solar cell panel and the method of manufacturing the same according to the present invention, a pair of busbars are provided on both sides adjacent to one cutting line, so that the effect of annealing through the heat treatment of the electrode is increased, five or six solar cell cells can be efficiently divided, and the amount of paste for forming the busbars can be reduced by about 50% because a plurality of busbars are provided in a dot shape.

MODES OF THE INVENTION

Figure 1:
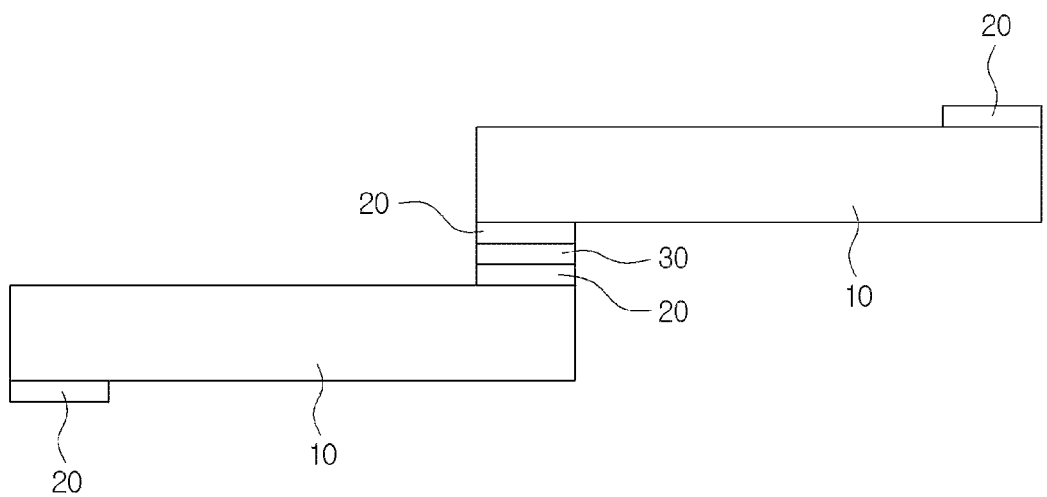
FIG. 1 is a schematic diagram of a conventional shingled solar cell module.

The above and other objects and novel features of the present invention will become more apparent from the description of the present specification and accompanying drawings.

As used herein, the term "wafer" is a solar cell wafer made of single crystal or polycrystalline silicon, and "solar cell" is provided in a form in which electrodes are screen printed on a P-type silicon substrate, and may be formed of p-passivated emitter and rearside contact (p-PERC), n-heterojunction with intrinsic thin layer (n-HIT), n-passivated emitter and rear totally diffused (n-PERT), and charge selective contact (CSC).

Also as used herein, "photovoltaic structure" means a device capable of converting light into electricity, which may include a plurality of semiconductors or other types of materials, and refers to a "solar cell" or "cell" is a photovoltaics (PV) structure that can convert light into electricity, may have various sizes and shapes, may be made of various materials, and may include semiconductor (for example, silicon) wafers or PV structures fabricated on a substrate or one or more thin films fabricated on a substrate (for example, glass, plastic, metal, or any other material capable of supporting a photovoltaic structure).

In addition, a "finger line," "finger electrode," "finger strip," or "finger" may refer to an extended electrically conductive (e.g., metal) electrode of photovoltaic structures, "busbar", "bus line" or "bus electrode" is an extended electrically conductive (for example, metal) electrode of a PV structure for collecting the current collected by two or more finger lines, generally wider than a finger line, and may be disposed on or within a photovoltaic structure, wherein a single photovoltaic structure may be provided with one or more busbars.

Meanwhile, a "metal grid" or "grid" is typically a collection of finger lines or busbars, which means formed by depositing a metal material layer on a photovoltaic structure, "solar cell strip", "photovoltaic strip" or "strip" is a part or segment of a PV structure, such as a solar cell, wherein the PV structure can be divided into a plurality of strips, the widths and lengths of which can be the same or different from each other.

In addition, the term "shingled array structure" refers to a string structure in which a solar cell provided with a front electrode and a back electrode is cut to form a plurality of strips in order to increase the conversion efficiency and output per unit of the solar cell module, and the front and back electrodes are bonded with a conductive adhesive to be connected.

In addition, the "solar cell module" means that a plurality of solar cell strings of a shingled array structure are electrically connected on a frame, glass is located on the front side, EVA sheet is formed on the rear side, and a filler material is placed in the middle to form a solar cell panel.

As used herein, the term "electroconductive adhesive (ECA)" is an electrically conductive adhesive used for bonding wiring of electrical and electronic products or circuits, and silver particles mixed with an epoxy resin may be used as the ECA. In addition, the conductive adhesive can be applied using a screen printing method or a micro dispenser, and the discharge amount from the needle must be constant and not flow down. As the conductive filler, metal powders such as gold, platinum, silver, copper, and nickel, carbon or carbon fibers, graphite, and composite powders may be used.

In addition, the wire used herein may be provided in a connection structure of, for example, SmartWire Connection Technology (SWCT).

Figure 2:
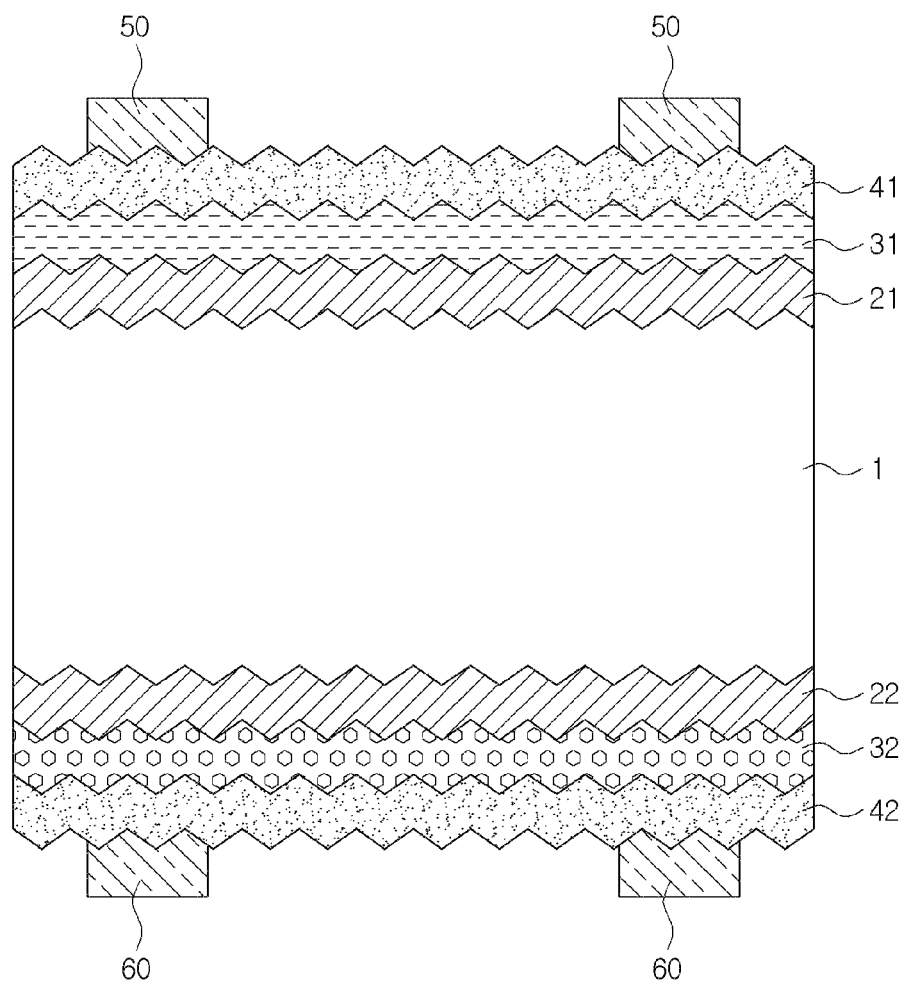
FIG. 2 is a schematic diagram of a general HIT solar cell applied to the present invention.

A heterojunction with intrinsic thin layer (HIT) solar cell applied to the present invention will be described with reference to FIG. 2. FIG. 2 is a schematic diagram of a general HIT solar cell applied to the present invention.

A HIT solar cell applied to the present invention may use those manufactured by the following: surface textures are formed by wet or dry etching both surfaces of an N-type crystalline silicon substrate 1 like a general crystalline silicon solar cell, and then, intrinsic a-Si:H passivation layers 21 and 22 are formed on both surfaces, a P-type a-Si:H layer 31 and an N-type a-Si:H layer 32 are formed on the two passivation layers 21 and 22, ITO transparent conductive layers (TCO) 41 and 42 are formed on the surface, and the upper electrode 50 and the lower electrode 60 are formed. However, it is not limited to the structure shown in FIG. 2, and a thinned, high-output HIT solar cell may be used according to various technological developments.

Hereinafter, an embodiment according to the present invention will be described with reference to the drawings.

Example 1

Figure 3:
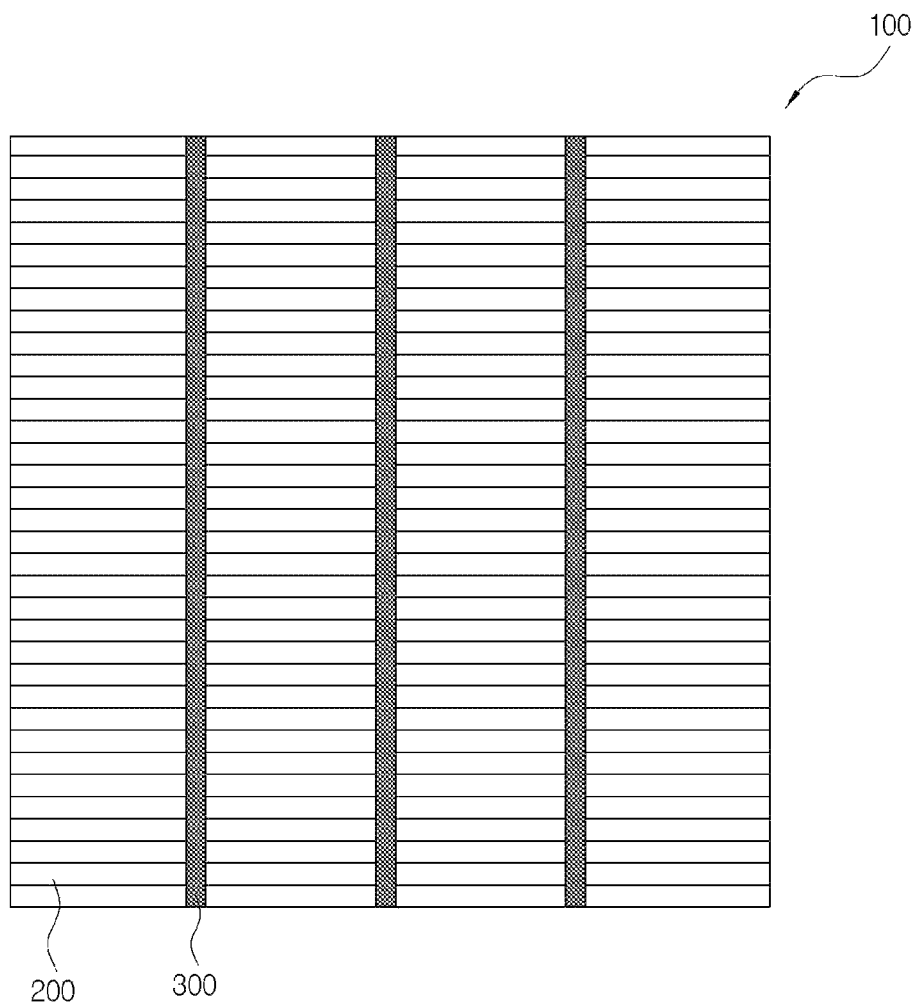
FIG. 3 is a plan view of a wafer coated with an adhesive applied to a shingled solar cell panel according to a first embodiment of the present invention.
Figure 4:
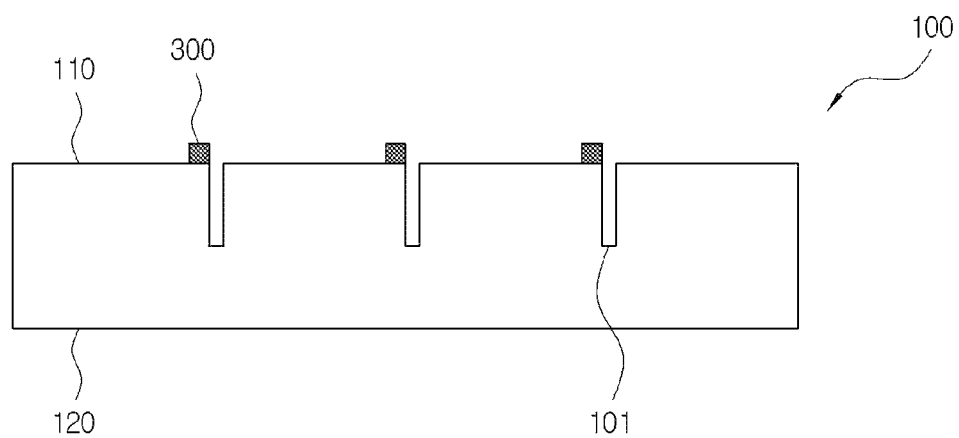
FIGS. 4 and 5 are cross-sectional views of a wafer for explaining the process of forming a strip according to the present invention.
Figure 5:
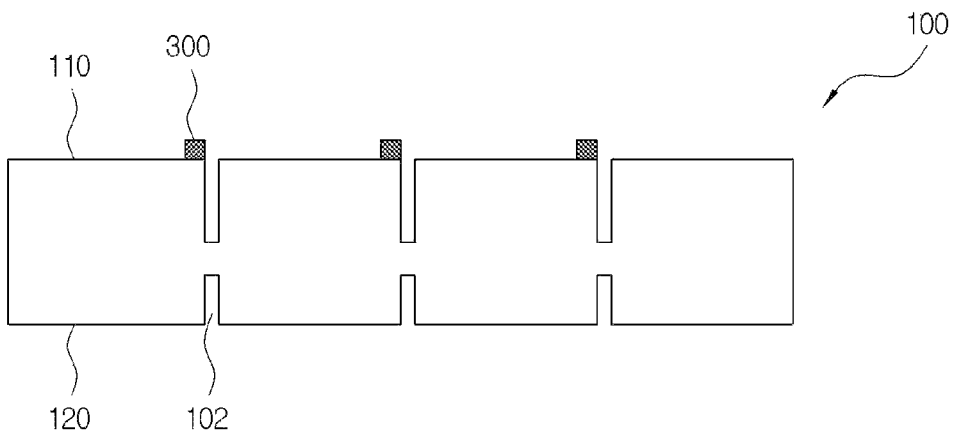
Figure 6:
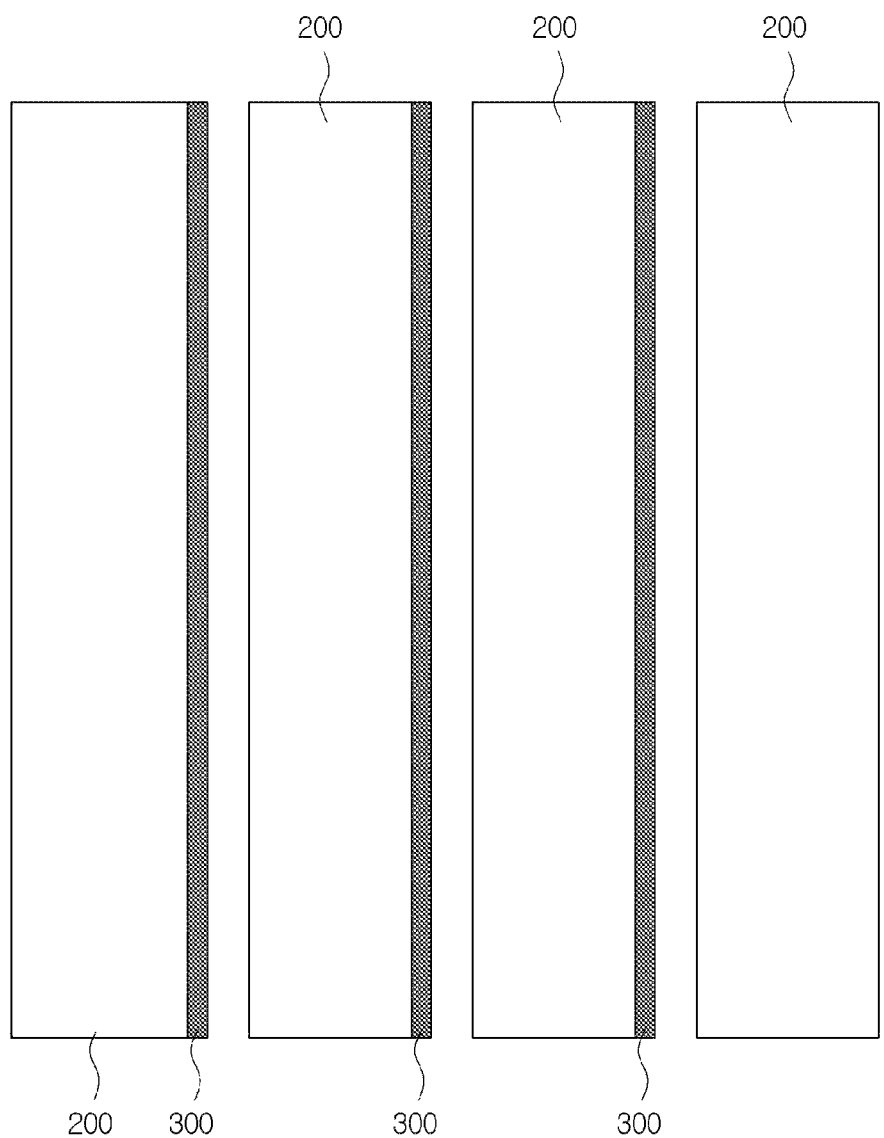
FIG. 6 is a perspective view of a strip prepared in accordance with the present invention.

FIG. 3 is a plan view of a wafer coated with an adhesive applied to a shingled solar cell panel according to Example 1 of the present invention, and FIGS. 4 and 5 are cross-sectional views of the wafer for explaining the process of forming a strip according to the present invention and FIG. 6 is a perspective view of a strip prepared according to the present invention.

First, in order to manufacture a shingled solar cell panel according to the present invention, a wafer for a solar cell having a four-corner tapered square shape (pseudo-squared) or a square shape (full-squared) is provided.

In the present invention, as shown in FIG. 3, a solar cell wafer 100 having a square shape is applied, but the present invention is not limited thereto, and a four-corner tapered square shape may be applied. In addition, as shown in FIG. 2, a wafer 100 having a heterojunction with intrinsic thin layer (HIT) structure in which an upper electrode 50 and a lower electrode 60 are formed as a plurality of conductive layers on the upper and lower portions, respectively, may be applied. That is, a plurality of conductive layers are provided on the wafer corresponding to each of the plurality of strips 200.

Next, as shown in FIG. 3, an adhesive layer 300 is formed by applying a conductive adhesive (ECA) on the upper conductive layer of the wafer 100. The adhesive layer 300 is provided in (N-1) strips according to the strips 200 in which the wafer 100 is to be divided into N strips, for example, 4, 5, 6, or the like. That is, as shown in FIG. 3, when the wafer 100 is divided into four strips 200, three adhesive layers 300 are provided, or when divided into five strips 200, four adhesive layers 300 are provided, and when divided into six strips 200, five adhesive layers 300 are provided only inside the wafer 100.

Application of the above-described conductive adhesive is provided in a batch by screen printing. However, the present invention is not limited thereto, and may be applied by using a micro dispenser.

Among the conductive adhesives on the market, these conductive adhesives are products with high conductivity and suitable viscosity suitable for the present invention. For example, SKC Panacol's EL-3012, EL-3556, EL-3653, EL-3655 and Henkel's CE3103WLV, CA3556HF can be applied, for example, an adhesive having the properties of a viscosity at 25° C. of 28,000-35,000 mPa·s (cP), as an electrical property, a volume resistivity of 0.0025 Ω·cm, a curing temperature of 130-150° C., and a curing time of 25-35 seconds may be applied. In addition, in the conductive adhesive, the conductive filler may include at least one material selected from Au, Pt, Pd, Ag, Cu, Ni, and carbon. However, the curing time and temperature of the conductive adhesive may be changed depending on the type of adhesive used, the application range and thickness of the adhesive, and the like.

Next, the wafer 100 on which the adhesive layer 300 is formed is divided into a plurality of strips 200. In the following description, a process of dividing into four strips 200 will be described with reference to FIG. 3.

First, as shown in FIG. 4, scribing with low energy levels of GREEN & UV LASER is performed at the top of the wafer along one side of the adhesive layer 300 (right side of adhesive layer 300, FIG. 4) so as to minimize surface burning and generation of burrs in the scribing process. As the low energy level laser, a GREEN & UV LASER having a wavelength of 335 nm, 442 nm, or 532 nm may be applied. Accordingly, the adhesive layer 300 provided on the wafer 100 may be used as a reference for guiding the movement direction of the laser in the scribing process.

That is, as shown in FIG. 4, a first groove 101 having a depth of less than 60% of the wafer thickness, preferably about 50% is formed in the upper portion 110 of the wafer 100, and as shown in FIG. 5, a second groove 102 of less than 40% of the wafer thickness is formed in the lower portion 120 of the wafer 100. In addition, the formation of the first groove 101 and the second groove 102 in the wafer 100 may be performed simultaneously.

Next, four strips are provided as shown in FIG. 6 by mechanical division from upper portion to lower portion for the wafer in which the first groove 101 and the second groove 102 are formed. Since such mechanical division can be easily realized by applying a device using a conventional solar cell, a detailed description thereof will be omitted.

As described above, since the busbar is not provided in the strip 200 according to the present invention, the manufacturing process is simplified by omitting the busbar forming process, and expensive materials for forming the busbar can be reduced.

Next, a process of forming a string using the strip provided as described above will be described with reference to FIG. 7.

Figure 7:
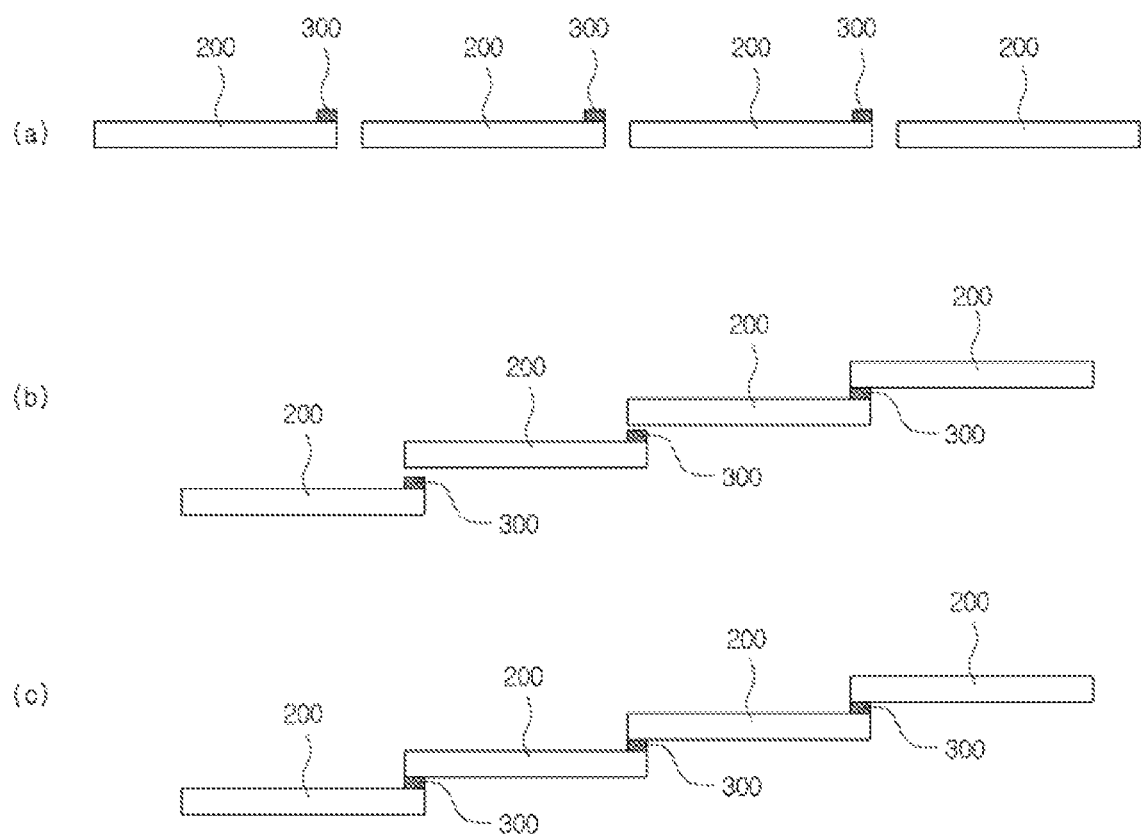
FIG. 7 is a process diagram for explaining the process of forming a string according to the present invention.

FIG. 7 is a process diagram for explaining the process of forming a string according to the present invention. In addition, although the description in FIG. 7 is described with the four strips 200 as shown in FIG. 6, the description is not limited thereto, and it is also applicable to five or six strips.

In the present invention, without using a busbar, a string as shown in FIG. 7 is formed by overlapping the lower conductive layer of another strip in the region where the adhesive layer 300 is provided among the divided strips 200.

That is, as shown in FIG. 7A, the four strips 200 shown in FIG. 6 are arranged, and as shown in FIG. 7B, the rightmost fourth strip among the four strips is overlapped on the third strip. Such overlapping is performed by positioning the conductive layer provided at the lower portion of the fourth strip on the adhesive layer 300 provided on the third strip.

The third strip is then overlapped on the second strip. Such overlapping is performed by positioning the conductive layer provided at the lower portion of the third strip on the adhesive layer 300 provided on the second strip.

The second strip is then overlapped on the first strip. Such overlapping is performed by aligning the conductive layer provided at the lower portion of the second strip on the adhesive layer 300 provided on the first strip, thereby completing the string shown in FIG. 7C. Accordingly, the upper and lower conductive layers of the plurality of strips are electrically bonded via only the adhesive layer 300.

Then, each string provided as described above is connected in series, parallel, or series-parallel to form a solar cell module.

As described above, since the present invention is not limited to a busbar as in the related art, the overlapping width of the strips can be easily controlled. That is, in the present invention, as shown in FIG. 6, since only the adhesive layer 300 is provided without the busbar being formed, a shingled solar cell can be formed by controlling the overlapping section of the strip 200 similarly, in addition to a defined overlapping interval as needed.

In addition, in the present invention, as shown in FIG. 6 before the formation of the string as described above, a conductive adhesive may be additionally applied to the edge portion of the divided strip, for example, the portion where the adhesive layer 300 is provided.

Example 2

Figure 8:
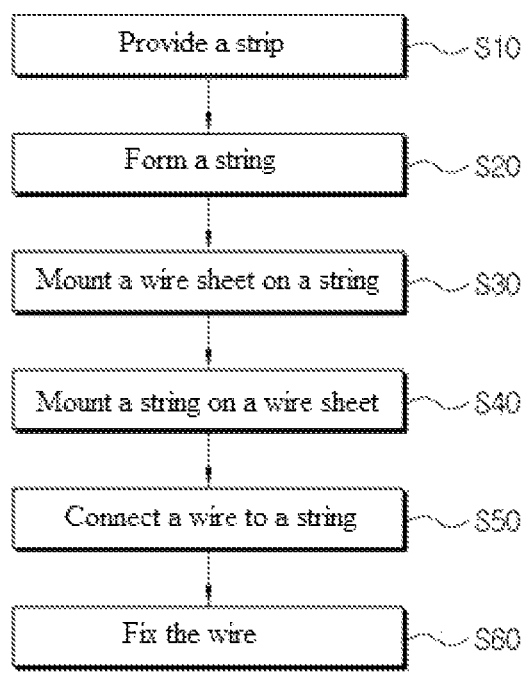
FIG. 8 is a process diagram for explaining a manufacturing process of a shingled solar cell panel having a wire according to Example 2 of the present invention.
Figure 9:
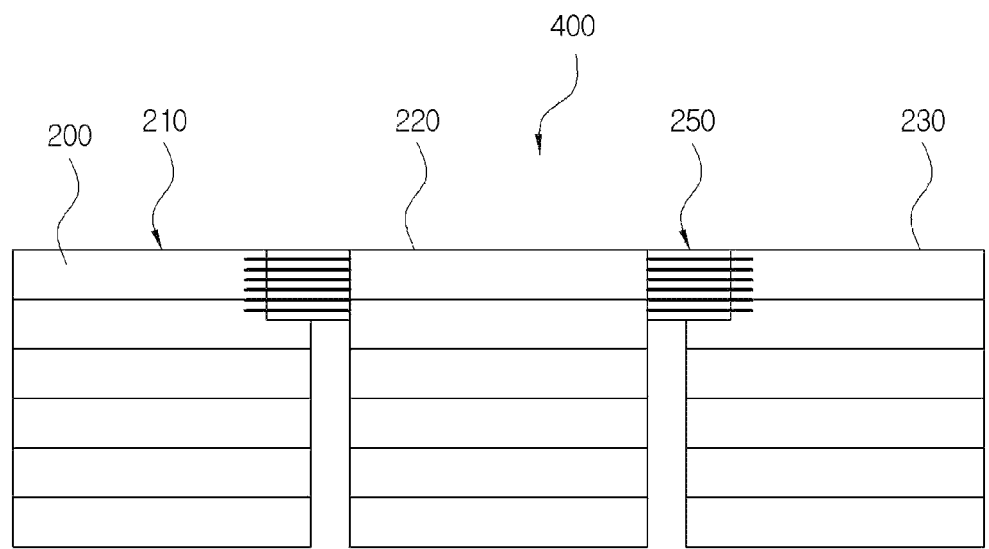
FIG. 9 is a perspective view of a shingled solar cell panel having a wire according to Example 2 of the present invention.
Figure 9:
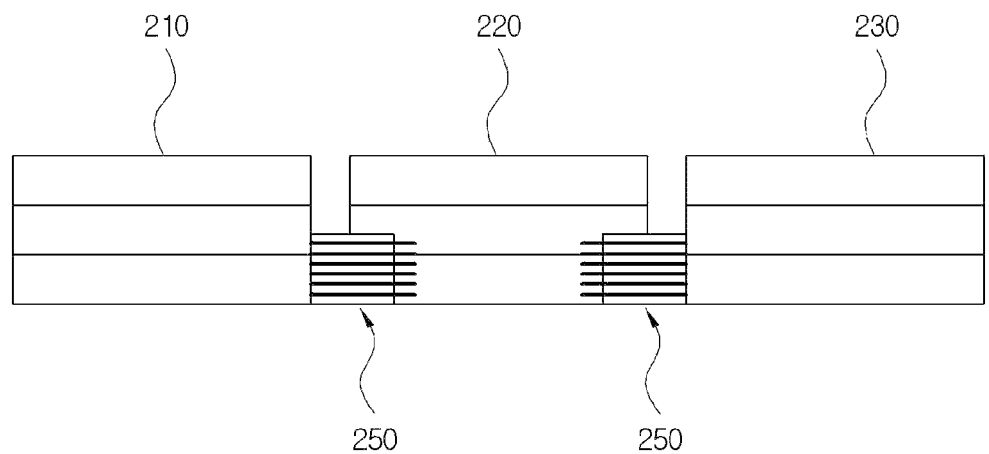
Figure 10:
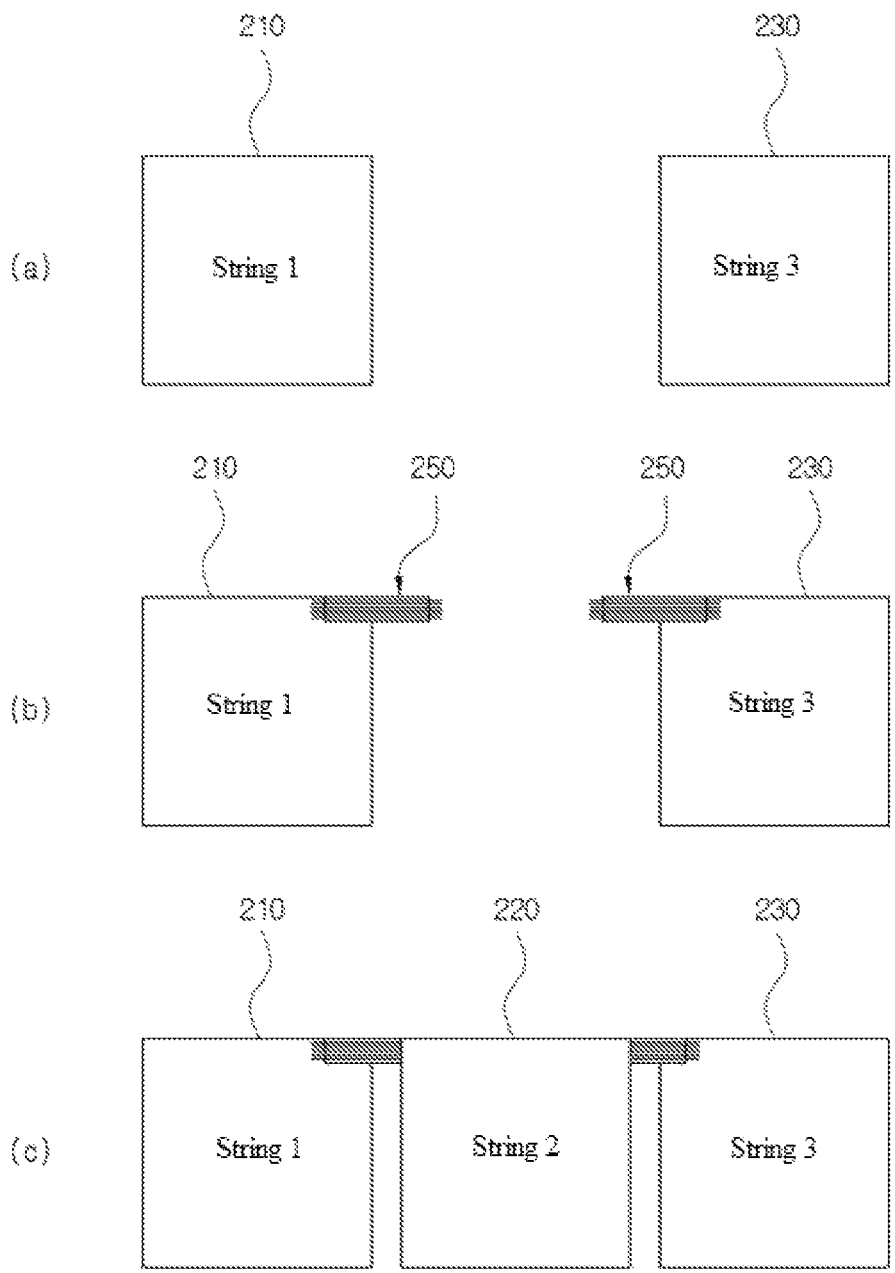
FIG. 10 is a schematic diagram for manufacturing the shingled solar cell panel shown in FIG. 9.

FIG. 8 is a flowchart illustrating a manufacturing process of a shingled solar cell panel having a wire according to Example 2 of the present invention, and FIG. 9 is perspective view of a shingled solar cell panel having a wire according to Example 2 of the present invention, FIG. 9A is a perspective view illustrating an example of a front state of the panel, FIG. 9B is a perspective view illustrating an example of a rear state of the panel, and FIG. 10 is a schematic diagram for manufacturing a shingled solar cell panel.

In order to manufacture a shingled solar cell panel 400 according to Example 2 of the present invention, as shown in FIGS. 8 and 9, a wafer for solar cells is provided, which consists of four-corner tapered square shape (pseudo-squared) or full-squared shape, and the wafer is cut into 4 or 5 pieces at constant intervals to provide a plurality of strips 200 (S10).

Next, the plurality of strips 200 provided in step S10 are partially overlapped with each other to form a string 210 of a shingled solar cell panel (S20).

Meanwhile, a plurality of wire sheets 250 on which a plurality of wires are respectively disposed are provided.

The wire sheet and the wire will be described with reference to FIGS. 11 and 12.

Figure 11:
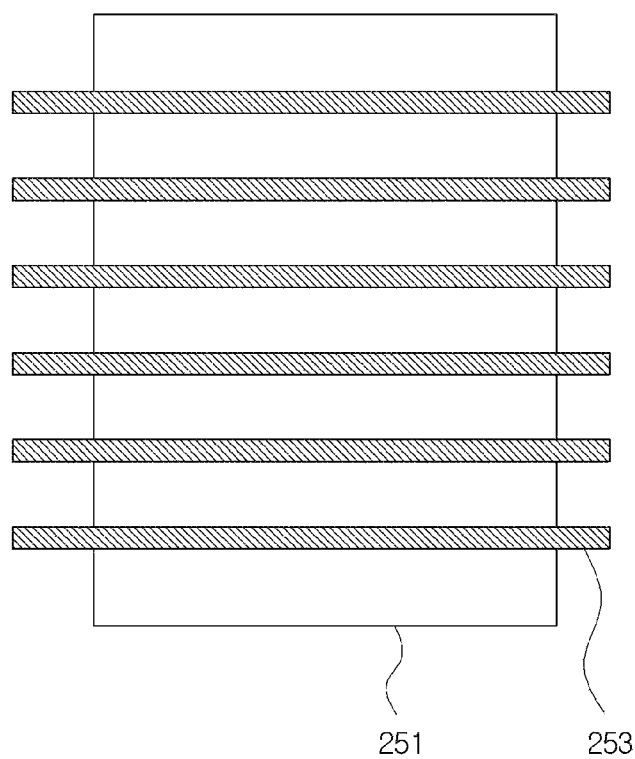
FIG. 11 is a perspective view of a wire sheet applied to Example 2 of the present invention.
Figure 11:
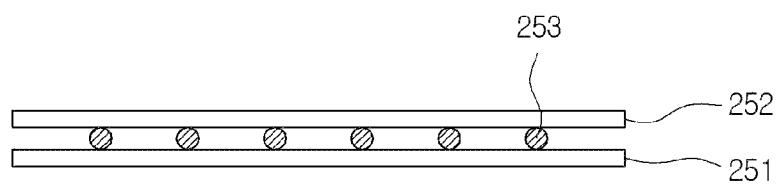

FIG. 11 is a perspective view of a wire sheet applied to Example 2 of the present invention. FIG. 11A is a schematic plan view of the wire sheet, FIG. 11B is a cross-sectional view of the wire sheet, and FIG. 12 is a cross-sectional view of a wire placed on the wire sheet As shown in FIG. 11, the wire sheet 250 includes a lower sheet 251 and an upper sheet 252, and a plurality of wires 253 are evenly arranged between the lower sheet 251 and the upper sheet 252. For example, although FIG. 11 shows a structure in which six wires are uniformly arranged, the present invention is not limited thereto and may be changed according to the electrode provided on the strip 200.

Each of the lower sheet 251 and the upper sheet 252 may be made of an ethylene-vinyl acetate copolymer (EVA) film used as a filler or a polyolefin (POF) film used as a shrink material, respectively, and as shown in FIG. 11B, when the wire 253 is disposed between the lower sheet 251 and the upper sheet 252 and compressed with a laminator, the wire 253 is fixed on the wire sheet 250. In addition, the lower sheet 251 and the upper sheet 252 are maintained in a substantially transparent state by compression as described above.

In addition, FIG. 11 shows a structure in which the wire 253 is provided between the lower sheet 251 and the upper sheet 252, but is not limited thereto, and the wire 253 may be attached to the lower sheet 251.

Meanwhile, both ends of the wire 253 are provided to protrude from the wire sheet 250 for electrical connection with the string 210 as shown in FIG. 11A.

Figure 12:
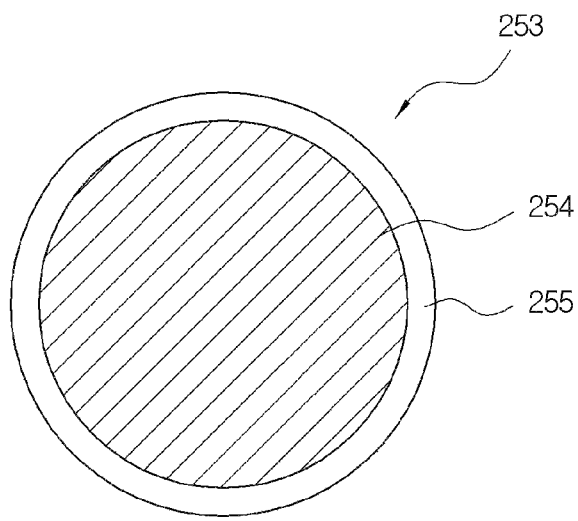
FIG. 12 is a cross-sectional view of a wire disposed on a wire sheet.

The wire 253 is formed with a diameter of 250 to 350 μm, and, as shown in FIG. 12, is made of a core 254 and a coating material 255 for coating the core 254, and the coating material 255 can be applied with a polymer that can melt when heated.

The core 254 is made of Cu, and the coating material 255 is a lead-free alloy and may be made of In/Sn, Bi/Sn, or pure Sn. That is, in the present invention, the effect of harmful metal elements on the environment can be minimized by solving the environmental problem caused by the toxicity of lead (Pb), and as a lead-free solder alloy having excellent solderability and toughness, an alloy composed of tin (Sn), bismuth (Bi) or indium (In) may be used, and silver (Ag) may be included to improve conductivity.

As one of the plurality of solar cells, after applying the string 210 provided in the above step S20 to dispose the first string 210 and the third string 230 at an interval in which the second string 220 is to be disposed, as shown in FIG. 10A, a first wire sheet and a second wire sheet as one of the plurality of wire sheets 250 are mounted on the upper surfaces of the first string 210 and the third string 230, as illustrated in FIG. 10B.

The arrangement interval between the string and the string according to the present invention is formed to be 0.5 to 1 mm or less. That is, in the present invention, since the string and the string are electrically connected by a wire, the arrangement interval in a solar cell using a conventional ribbon can be made narrower. Accordingly, in the present invention, the degree of cell integration in a limited area can be increased, and high output and efficiency can be realized. In addition, when using a conventional ribbon, it is possible to solve the problem that the arrangement interval is wide and thus, the ribbon is cut.

In the step S30, a portion of the wire protruding from the first wire sheet to the left (for example, the left side in the state shown in FIG. 11A) is positioned on the upper surface of the first string 210, and a portion of the wire protruding to the right from the second wire sheet (for example, the right side in the state shown in FIG. 11A) is positioned on the upper surface of the string 230.

Also, in step S30, the first string 210 and the first wire sheet are electrically connected and the third string 230 and the second wire sheet are electrically connected so that the wire sheet 250 is fixed on the string, and thus electrical connection can be implemented.

The electrical connection between the string and the wire is made using, for example, a solder device capable of applying a melting point higher than the melting point of In/Sn, Bi/Sn, or pure Sn as a lead-free alloy by melting the polymer in which the wire 253 is embedded, and the process of melting the polymer upon application of heat exposes the coating material 255 of the wire 253, and electrical bonding is carried out by soldering the electrode of the string with the coating material 255.

As described above, in the present invention, since the electrical connection between the string and the string is performed using a wire, power loss that may occur when the string is connected to the string can be minimized.

Next, as shown in FIG. 10C, as one of the plurality of solar cells, a second string 220 is mounted on the first and second wire sheets provided in step S30 (S40).

That is, a portion of the wire protruding to the right from the first wire sheet (for example, the right side in the state shown in FIG. 11A) is positioned on the lower surface of the second string 220, and on the lower surface of the second string 220, a wire (for example, left in the state shown in FIG. 11A) protruding to the left from the second wire sheet is positioned. Such an arrangement state is as shown in FIG. 9B.

Then, the second string 220 is electrically connected by a plurality of wires respectively provided on the first and the second wire sheets. Electrical connection between the second string 220 and the first and the second wire sheets may also be performed by soldering as described above.

In addition, although a structure in which the first string 210 and the third string 230 are electrically connected to a plurality of wires respectively provided on the first wire sheet and the second wire sheet, and then the second string 220 is electrically connected with a number of wires respectively provided on a first wire sheet and a second wire sheet is described, the present invention is not limited thereto, in a state in which a first wire sheet and a second wire sheet are disposed on the first string 210 and the third string 230 and the second string 220 is disposed on the first and second wire sheets, electrical connection with the wire can be sequentially performed for the first to third strings 210, 220 and 230 (S50).

After the electrical connection between the first string 210, the second string 220, and the third string 230 and the wire is completed in step S50, a plurality of wires respectively provided on the first and the second wire sheets are fixed to the solar cell (S60).

In step S60, the fixing of the plurality of wires is performed by providing an EVA film on the lower portions of the string and the adjacent string, for example, the lower portions of the first string 210 and the second string 220, and the EVA film is pressed to fix multiple wires on the surfaces of the first string 210 and the second string 220.

In addition, in the method for manufacturing a shingled solar cell panel according to Example 2 of the present invention, the wire sheet is disposed so as not to correspond to one strip but is also disposed on the adjacent strip portion as shown in FIG. 9, and by disposing this wire sheet 250 on an adjacent strip, fix the wire may be more securely fixed.

Next, another example of a wire sheet applied to Example 2 of the present invention will be described with reference to FIGS. 13 to 15.

Figure 13:
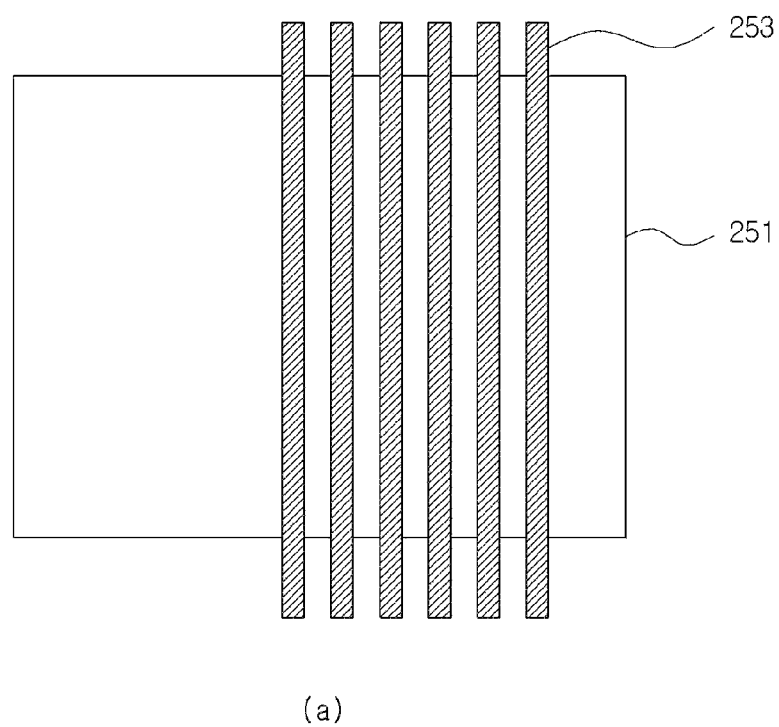
FIG. 13 is a perspective view of another example of a wire sheet applied to Example 2 of the present invention.
Figure 13:
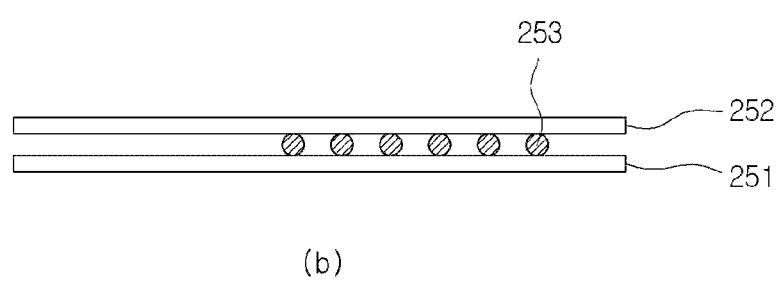

In the wire sheet shown in FIG. 11, a plurality of wires 253 are equally arranged between the lower sheet 251 and the upper sheet 252, but as shown in FIG. 13, a structure in which the wire 253 is provided only in the connection portion of the string 210 can be applied.

FIG. 13 is a perspective view of another example of a wire sheet applied to Example 2 of the present invention, FIG. 13A is a schematic plan view of the wire sheet, and FIG. 13B is a cross-sectional view of the wire sheet.

As shown in FIG. 13, when the wire 253 is disposed close to the string connection portion, only the wire sheet portion can be more firmly fixed to the adjacent strip portion. In addition, there is an advantage that the soldering process between the wire and the electrode of the strip can be simplified.

Figure 14:
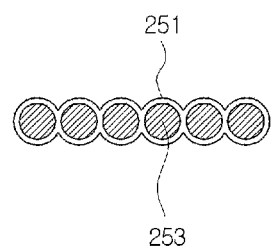
FIG. 14 is a cross-sectional view of still another example of a wire sheet applied to Example 2 of the present invention.

In addition, although the structure shown in FIGS. 11 and 13 shows a structure in which a plurality of wires 253 are disposed between the lower sheet 251 and the upper sheet 252, as shown in FIG. 14, the arrangement relationship of the wires 253 can be kept uniform by integrally providing the lower sheet 251 with an opening into which the wire 253 is to be inserted.

FIG. 14 is a cross-sectional view of another example of a wire sheet applied to Example 2 of the present invention.

Figure 15:
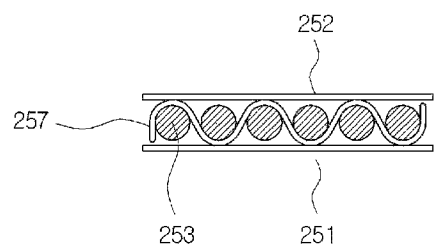
FIG. 15 is a cross-sectional view of yet another example of a wire sheet applied to Example 2 of the present invention.

In addition, as shown in FIG. 15, by providing a wavy wire arrangement film 257 between the lower sheet 251 and the upper sheet 252, the insulation between the wire and the wire can be improved while uniformly maintaining the arrangement relationship of the wires 253.

FIG. 15 is a cross-sectional view of another example of a wire sheet applied to Example 2 of the present invention.

Example 3

Figure 16:
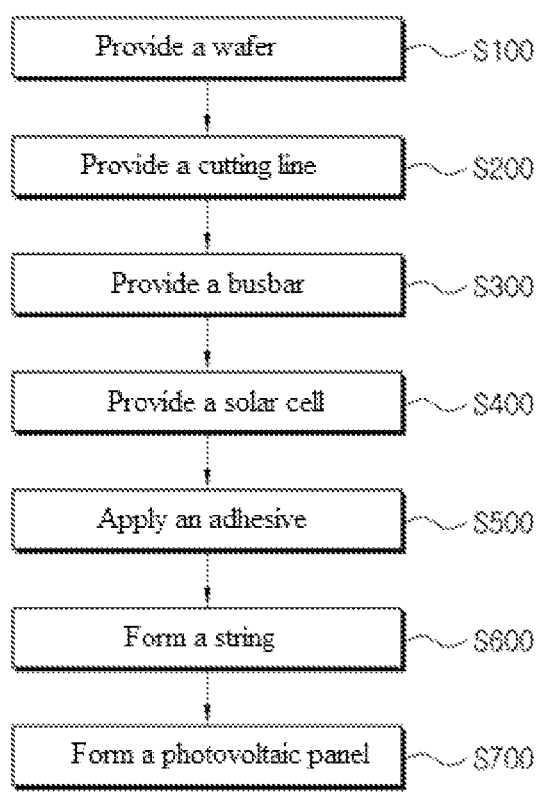
FIG. 16 is a process diagram for explaining a manufacturing process of a shingled solar cell panel according to Example 3 of the present invention.
Figure 17:
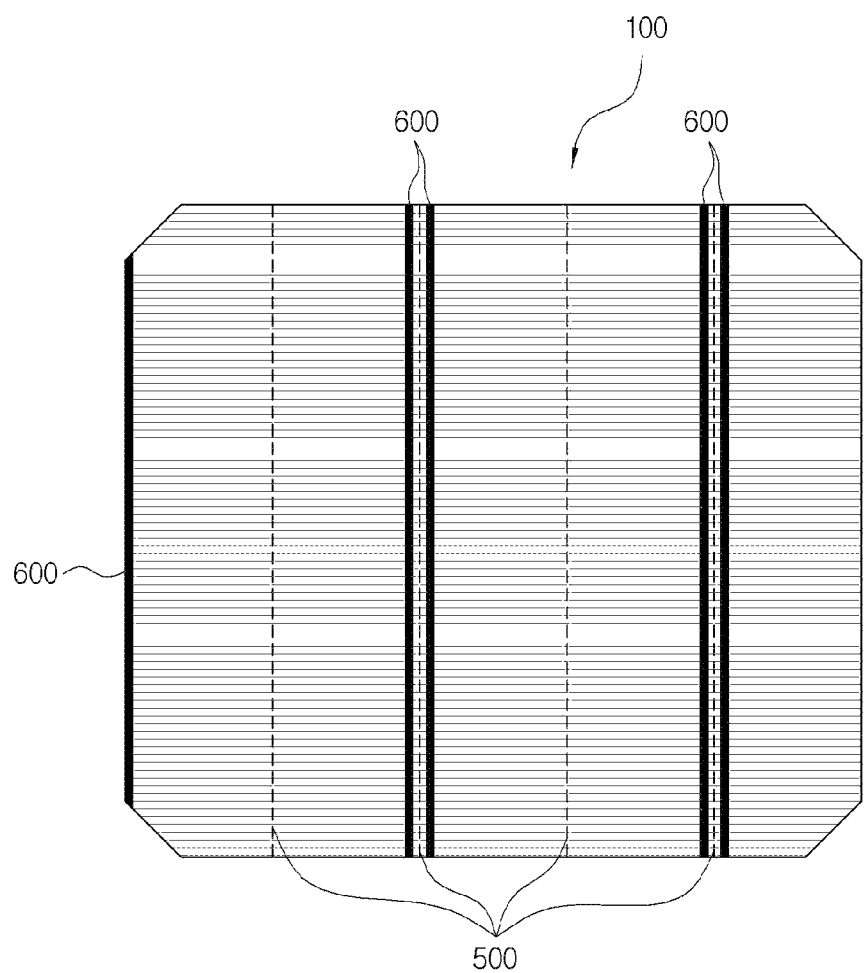
FIG. 17 is a perspective view of the front portion of a wafer for manufacturing a shingled solar cell panel according to Example 3 of the present invention.
Figure 18:
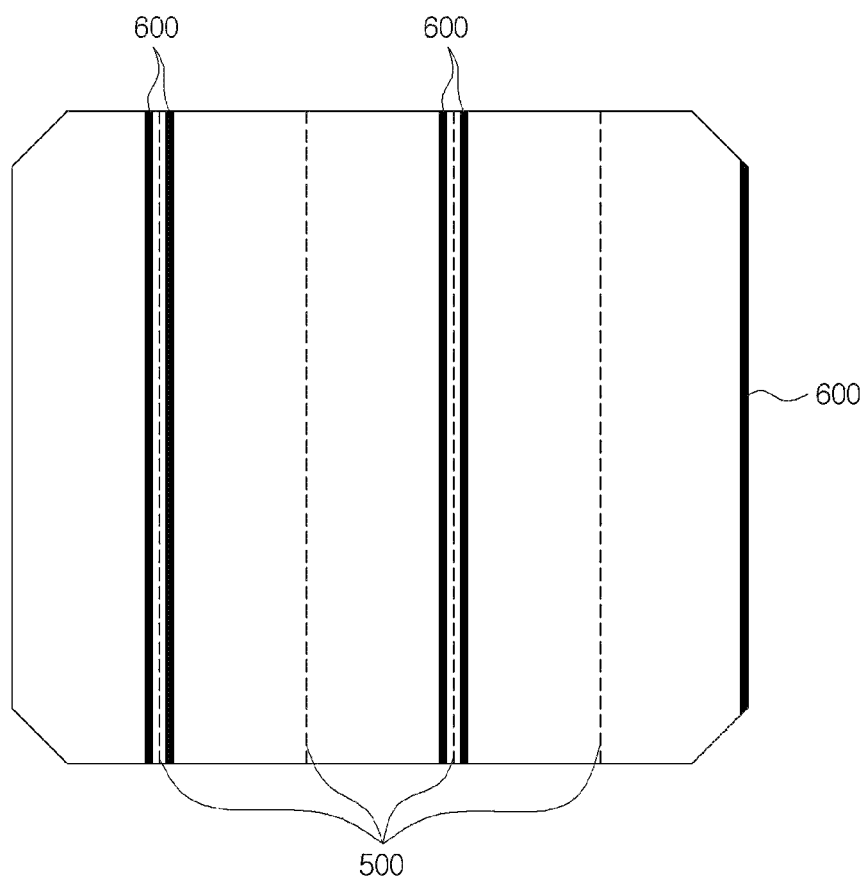
FIG. 18 is a perspective view of the rear portion of the wafer shown in FIG. 17.

FIG. 16 is a flowchart for explaining a manufacturing process of a shingled solar cell panel according to Example 3 of the present invention, FIG. 17 is a perspective view of a front portion of a wafer for manufacturing a shingled solar cell panel according to Example 3 of the present invention, and FIG. 18 is a perspective view of a rear portion of the wafer shown in FIG. 17.

First, in order to manufacture a shingled solar cell panel according to the present invention, a solar cell wafer 100 as shown in FIGS. 17 and 18 is provided (S100). The wafer 100 is a wafer for a solar cell and may be made of single crystal or polycrystalline silicon, and is provided in a four-corner tapered square shape (pseudo-squared).

Next, as shown in FIGS. 17 and 18, respectively, a plurality of cutting lines 500 are provided on the front and rear portions of the wafer 100 provided in step S100 (S200).

A plurality of cutting lines 500 provided in the front portion and the rear portion are provided as a first cutting line, a second cutting wire, a third cutting wire and a fourth cutting wire such that the widths of the respective solar cells after cutting along a certain interval, i.e., the cutting lines, are the same.

In addition, a plurality of busbars 600 are provided on the front and rear portions of the wafer 100, respectively (S300). Each busbar 600 is provided with a width of 1.1 to 1.4 mm.

As shown in FIG. 17, the busbar 600 provided on the front portion is provided on one edge portion on the left side, on both sides of the second cutting line and on both sides of the fourth cutting line. In addition, as shown in FIG. 18, the busbars 600 provided on the rear portion are provided on both sides of the first cutting line, on both sides of the third cutting line and on the other edge portion on the right side.

That is, in the manufacturing of the shingled solar cell panel according to the present invention, unlike the related art, the busbars 600 may be provided as a pair on both sides adjacent to one cutting line 500.

A pair of busbars provided on both sides adjacent to the one cutting line are formed at an interval of 270 to 350 μm, preferably 600 μm.

Next, the wafer 100 is cut along the plurality of cutting lines 500 to provide a plurality of solar cells (S400).

Therefore, in the manufacture of the shingled solar cell panel according to Example 3 of the present invention, five solar cells can be provided.

On the other hand, in Example 3 of the present invention, as shown in FIGS. 17 and 18, since the busbar 600 is provided as a pair on both sides adjacent to one cutting line 500, in the step S400, when the wafer 100 is cut with a scriber along the cutting line 500, the pair of busbars 600 can realize the guide function of the scriber. In addition, when scribing by laser irradiation is executed, the effect of annealing through heat treatment of the electrode in the adjacent busbar 600 is increased. In particular, when applied to a heterojunction with intrinsic thin layer (HIT) cell formed in a low-temperature process, the annealing effect is further increased.

Also, the scribing may be performed by, for example, a nano-second laser (532 nm, 20 ns, 30-100 KHz from Coherent). That is, it can be executed by setting an average power of 10 W, a frequency of 50 KHz, and a scan rate of 1,600 mm/s in a 20 ns laser using a 532 nm wavelength.

Next, a conductive adhesive is applied to at least one of the busbar 600 of the front portion and the busbar 600 of the rear portion of the five solar cells provided in step S400 (S500).

Among the conductive adhesives on the market, these conductive adhesives are products with high conductivity and suitable viscosity. For example, SKC Panacol's EL-3012, EL-3556, EL-3653, EL-3655 and Henkel's CE3103WLV, CA3556HF can be applied, for example, an adhesive having the properties of a viscosity at 25° C. of 28,000-35,000 mPa·s (cP), as an electrical property, a volume resistivity of 0.0025 Ω·cm, a curing temperature of 130-150° C., and a curing time of 25-35 seconds may be applied. In addition, in the conductive adhesive, the conductive filler may include at least one material selected from Au, Pt, Pd, Ag, Cu, Ni, and carbon. In addition, the conductive adhesive may be performed by controlling the amount of discharge from the needle of a micro dispenser having a diameter of, for example, 250 μm, by control of the RPM.

Next, a solar cell string having a shingled module structure is formed by serially connecting the front busbar and the rear busbar to which the conductive adhesive is applied in step S500 (S600). String formation in step S600 may be performed under heat treatment conditions of, for example, 25 to 35 seconds and 130 to 150° C.

Then, each string provided in step S600 is connected in series, parallel, or series-parallel to form a solar cell panel (S700).

As described above, in the manufacturing of the shingled solar cell panel according to Example 3 of the present invention, a structure in which five solar cells are efficiently divided can be provided.

Example 4

Next, the manufacturing of the shingled solar cell panel according to Example 4 of the present invention will be described with reference to FIGS. 19 and 20. Moreover, in Example 4, the same parts as those in Example 1 are denoted by the same reference numerals, and repeated description thereof is omitted.

Figure 19:
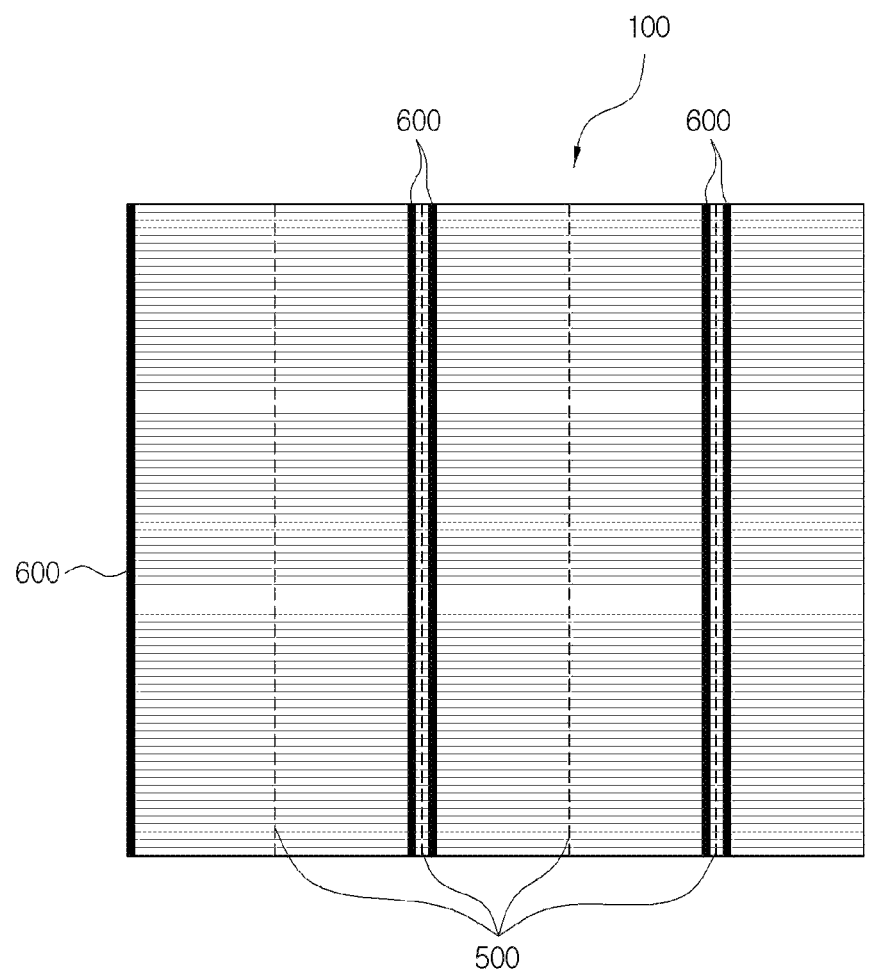
FIG. 19 is a perspective view of the front portion of a wafer for manufacturing a shingled solar cell panel according to Example 4 of the present invention.
Figure 20:
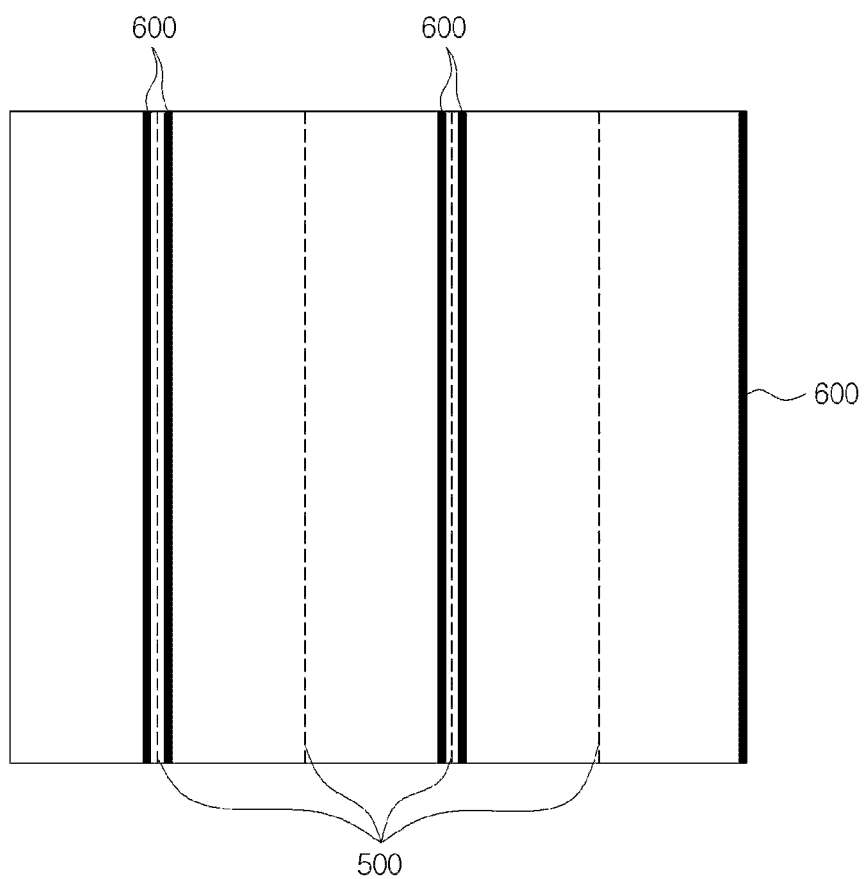
FIG. 20 is a perspective view of the rear portion of the wafer shown in FIG. 19.

FIG. 19 is a perspective view of a front portion of a wafer for manufacturing a shingled solar cell panel according to Example 4 of the present invention, and FIG. 20 is a perspective view of a rear portion of the wafer shown in FIG. 19.

In Example 4 of the present invention, as shown in FIGS. 19 and 20, unlike the wafer of Example 1 in which the four corners have a tapered square shape, the wafer 100 has a full-squared shape.

Also in this Example 4, since the busbars 600 are provided as a pair on both sides adjacent to one cutting line 500, and the edge portions of the wafer 100 are provided to have the same length as the central portion, waste of material for forming the busbars can be prevented, and since the edge portion of both left and right sides of the wafer 100 can be used in the same manner as the central portion, the manufacturing efficiency of the solar cell panel can be improved compared to Example 1.

Example 5

Next, the manufacturing of the shingled solar cell panel according to Example 5 of the present invention will be described with reference to FIGS. 21 and 22. Moreover, in Example 5, the same parts as those in Example 3 are denoted by the same reference numerals, and repeated description thereof is omitted.

Figure 21:
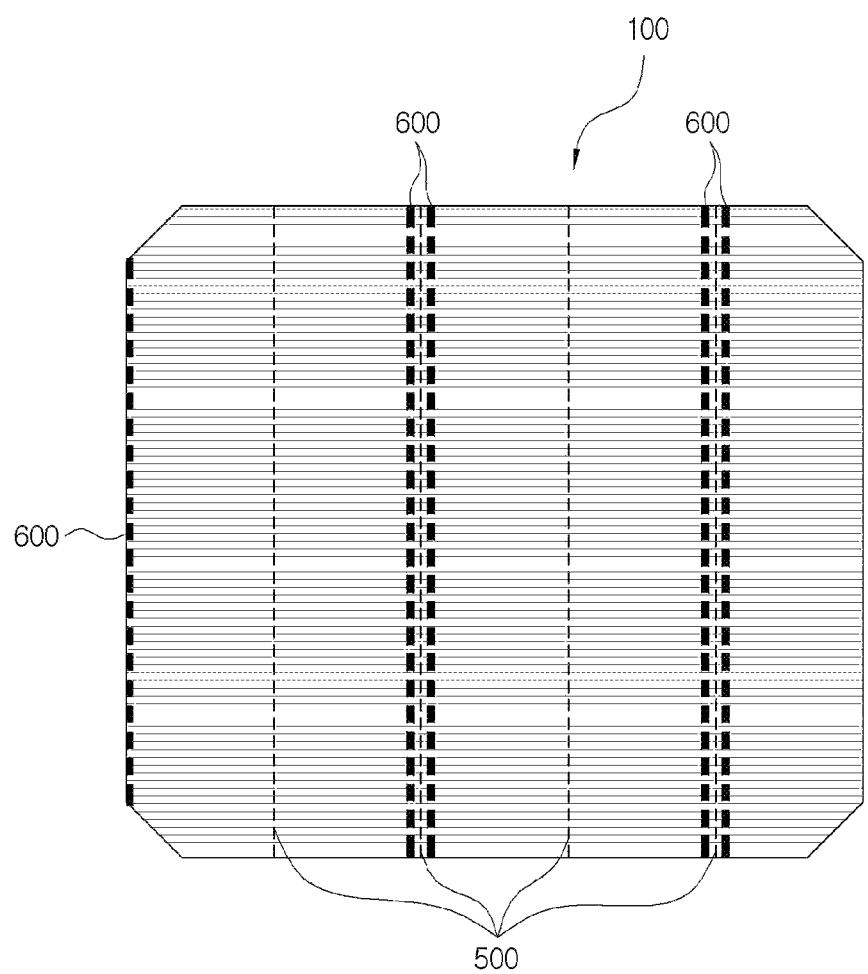
FIG. 21 is a perspective view of the front portion of a wafer for manufacturing a shingled solar cell panel according to Example 5 of the present invention.
Figure 22:
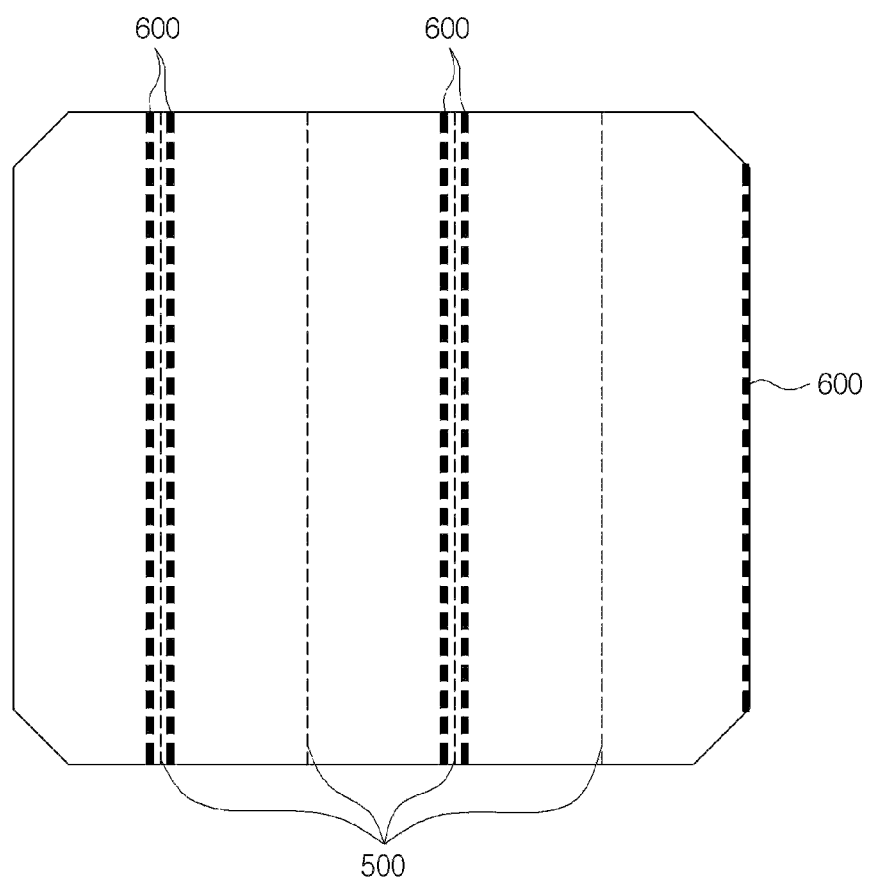
FIG. 22 is a perspective view of the rear portion of the wafer shown in FIG. 21.

FIG. 21 is a perspective view of a front portion of a wafer for manufacturing a shingled solar cell panel according to Example 5 of the present invention, and FIG. 22 is a perspective view of a rear portion of the wafer shown in FIG. 21.

In Example 5 of the present invention, as in Example 3, the wafer 100 may be made of single crystal or polycrystalline silicon as a solar cell wafer, and the four corners are provided in a tapered pseudo-squared shape, and a busbar 600 is provided as a pair on both sides adjacent to one cutting line 500, and as shown in FIGS. 21 and 22, a plurality of busbars 600 provided on each of front and rear portions of the wafer 100 are formed in a dot shape.

In Example 5, since the plurality of busbars 600 are formed in a dot shape, the amount of paste for forming the busbars can be reduced by about 50% compared to Example 3.

Example 6

Next, the manufacturing of the shingled solar cell panel according to Example 6 of the present invention will be described with reference to FIGS. 23 and 24. Moreover, in Example 6, the same parts as those in Example 4 are denoted by the same reference numerals, and repeated description thereof is omitted.

Figure 23:
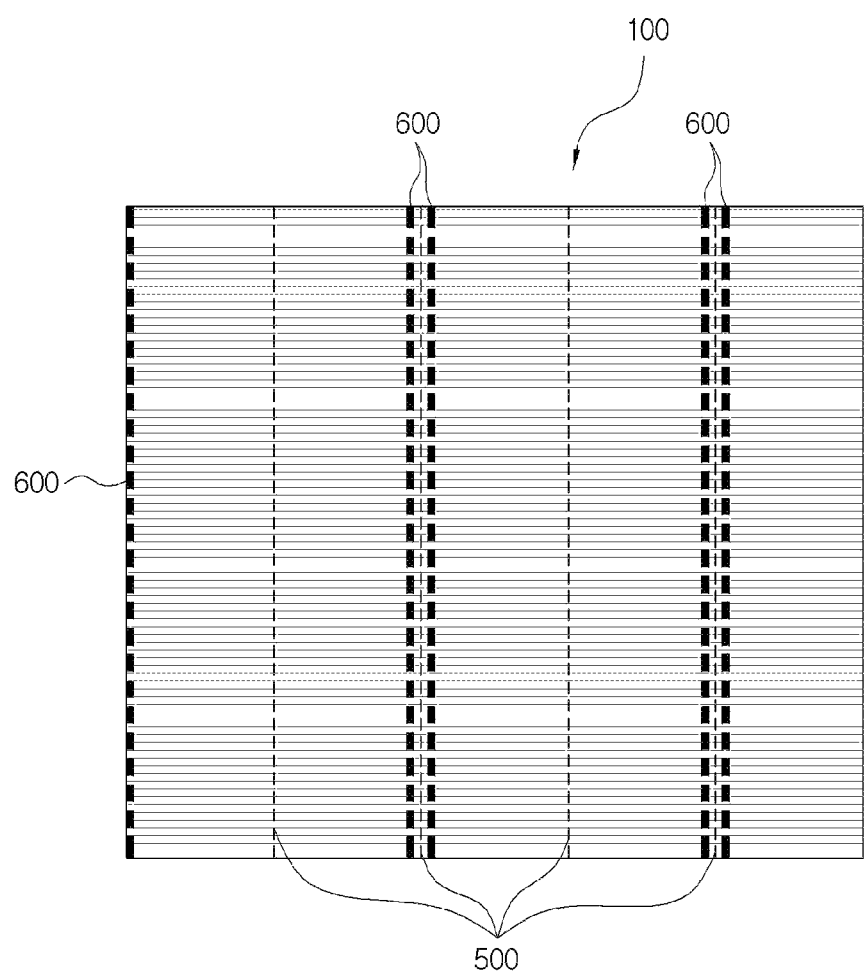
FIG. 23 is a perspective view of the front portion of a wafer for manufacturing a shingled solar cell panel according to Example 6 of the present invention.
Figure 24:
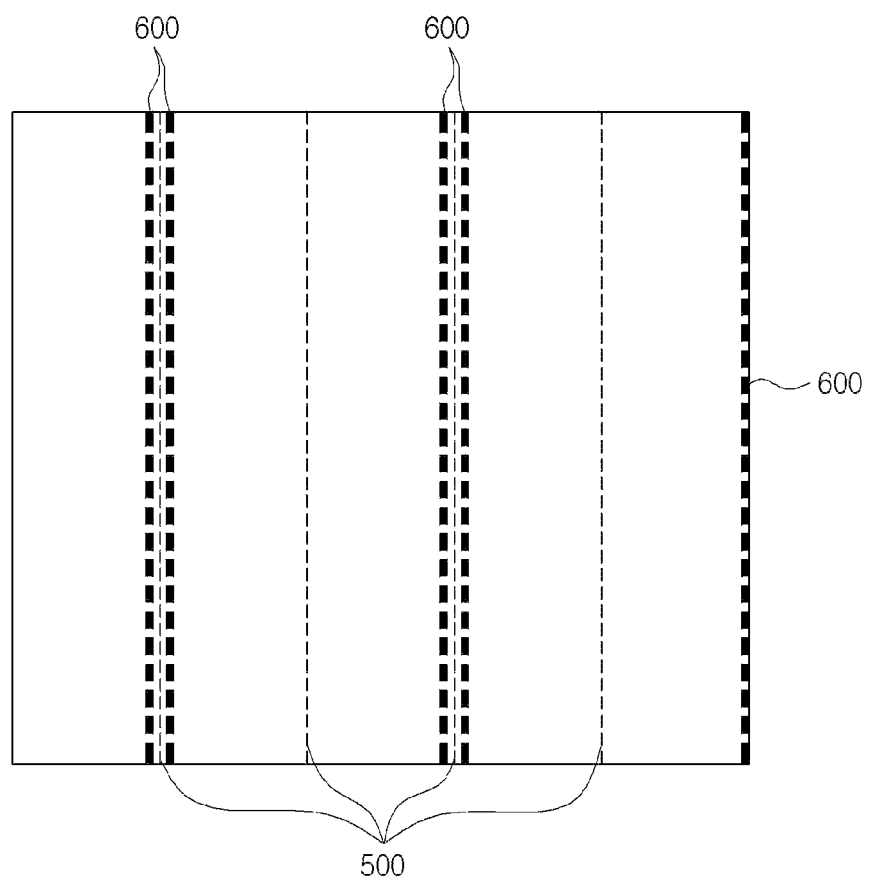
FIG. 24 is a perspective view of the rear portion of the wafer shown in FIG. 23.

FIG. 23 is a perspective view of a front portion of a wafer for manufacturing a shingled solar cell panel according to Example 6 of the present invention, and FIG. 24 is a perspective view of a rear portion of the wafer shown in FIG. 23.

In Example 6 of the present invention, as in Example 4, the wafer 100 is formed in a full-squared shape as shown in FIGS. 23 and 24, and a busbar 600 is provided as a pair on both sides adjacent to one cutting line 500, and a plurality of busbars 600 provided on each of front and rear portions of the wafer 100 are formed in a dot shape.

In Example 6, since the plurality of busbars 600 are formed in a dot shape, the amount of paste for forming the busbars can be reduced by about 50% compared to Example 4.

Example 7

Next, the manufacturing of the shingled solar cell panel according to Example 7 of the present invention will be described with reference to FIGS. 25 and 26. Moreover, in Example 7, the same parts as those in Example 3 are denoted by the same reference numerals, and repeated description thereof is omitted.

Figure 25:
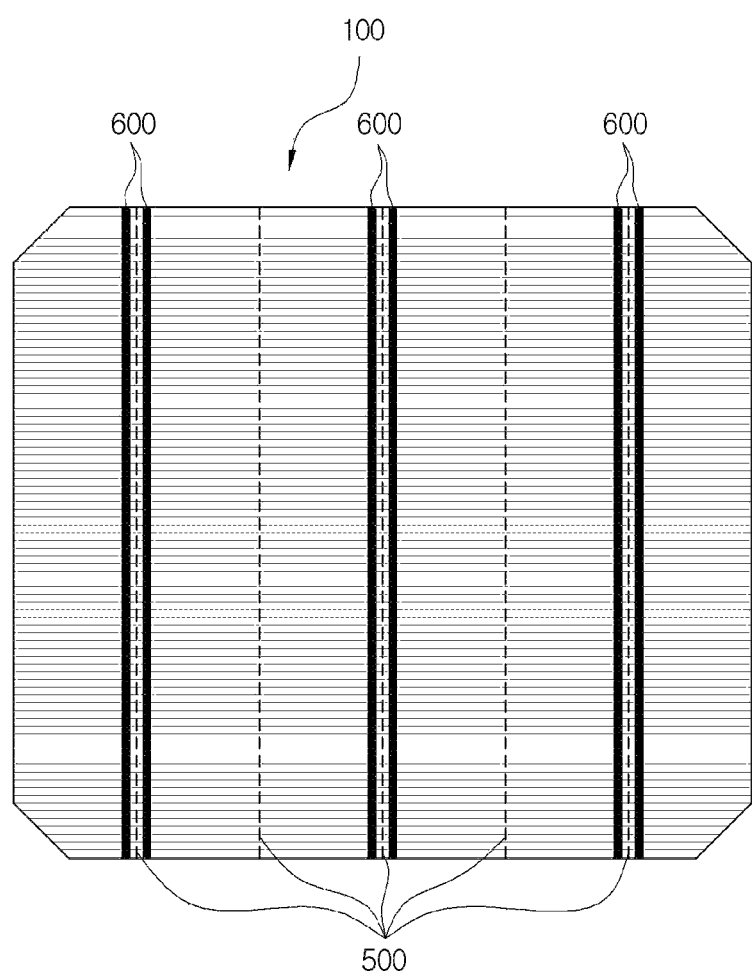
FIG. 25 is a perspective view of the front portion of a wafer for manufacturing a shingled solar cell panel according to Example 7 of the present invention.
Figure 26:
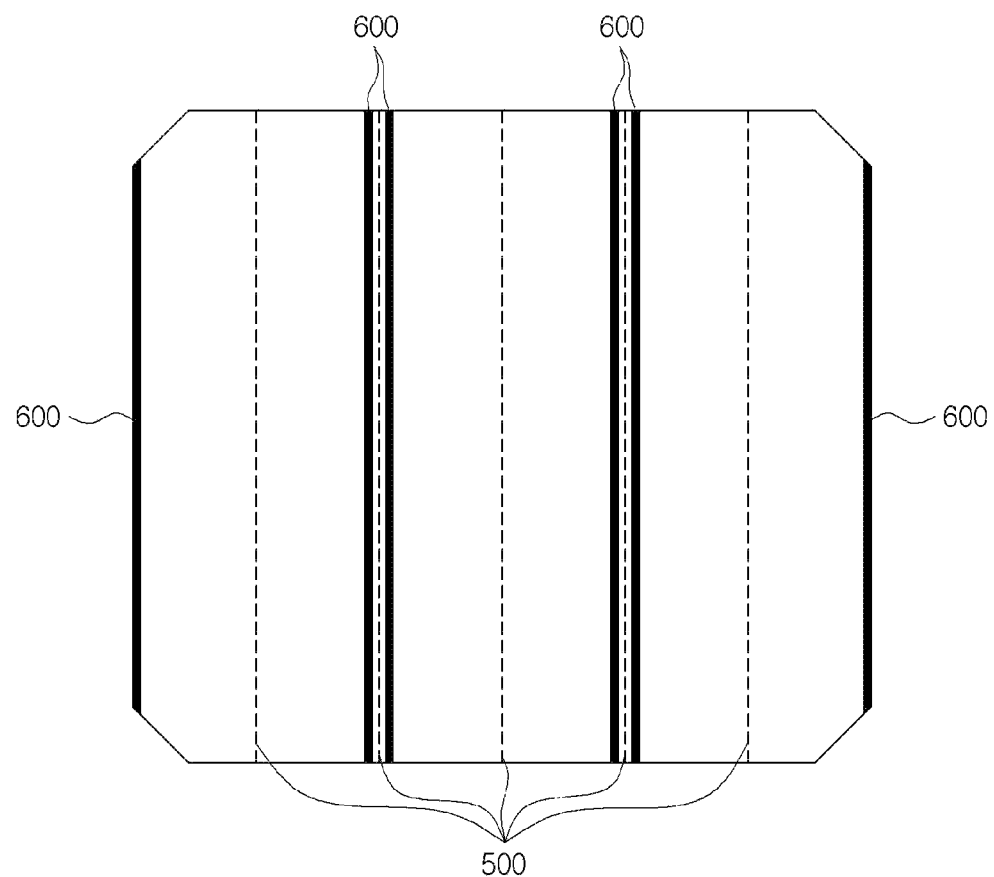
FIG. 26 is a perspective view of the rear portion of the wafer shown in FIG. 25.

FIG. 25 is a perspective view of a front portion of a wafer for manufacturing a shingled solar cell panel according to Example 7 of the present invention, and FIG. 26 is a perspective view of a rear portion of the wafer shown in FIG. 25.

In order to manufacture a shingled solar cell panel according to Example 7 of the present invention, as shown in FIGS. 25 and 26, the wafer 100 is provided in a pseudo-squared shape with four tapered corners.

In addition, a plurality of cutting lines 500 provided on the front surface portion and the rear surface portion of the wafer 100 are provided at constant intervals, that is, a first cutting line, a second cutting line, a third cutting line, a fourth cutting line and a fifth cutting line, such that widths of solar cells after cutting along the cutting line become equal to each other, and on the front surface portion of the wafer 100, as shown in FIG. 25, busbars 600 are provided on both sides of the first cutting line, on both sides of the third cutting line and on both sides of the fifth cutting line; and on the rear surface portion, one edge portion, on both sides of the second cutting line, on both of the fourth cutting line and the other edge portion are provided with a busbar 600, as illustrated in FIG. 26.

That is, in the manufacturing of the shingled solar cell panel according to Example 7 of the present invention, unlike the related art, the busbar 600 is provided as a pair on both sides adjacent to one cutting line 500, and six solar cells can be provided.

Also in Example 7 according to the present invention, as in the third embodiment described above, since the busbar 600 are provided as a pair on both sides adjacent to one cutting line 500, when the wafer 100 is cut with a scriber along the cutting lines 500, the pair of busbars 600 can realize the guide function of the scriber, and when scribing by laser irradiation is performed, the effect of annealing through heat treatment of the electrode is increased in the adjacent busbar 600.

In addition, in Example 7 related to the manufacture of a shingled solar cell panel according to the present invention, a structure for efficiently dividing six solar cells can be provided.

Example 8

Next, the manufacturing of the shingled solar cell panel according to Example 8 of the present invention will be described with reference to FIGS. 27 and 28. Moreover, in Example 8, the same parts as those in Example 7 are denoted by the same reference numerals, and repeated description thereof is omitted.

Figure 27:
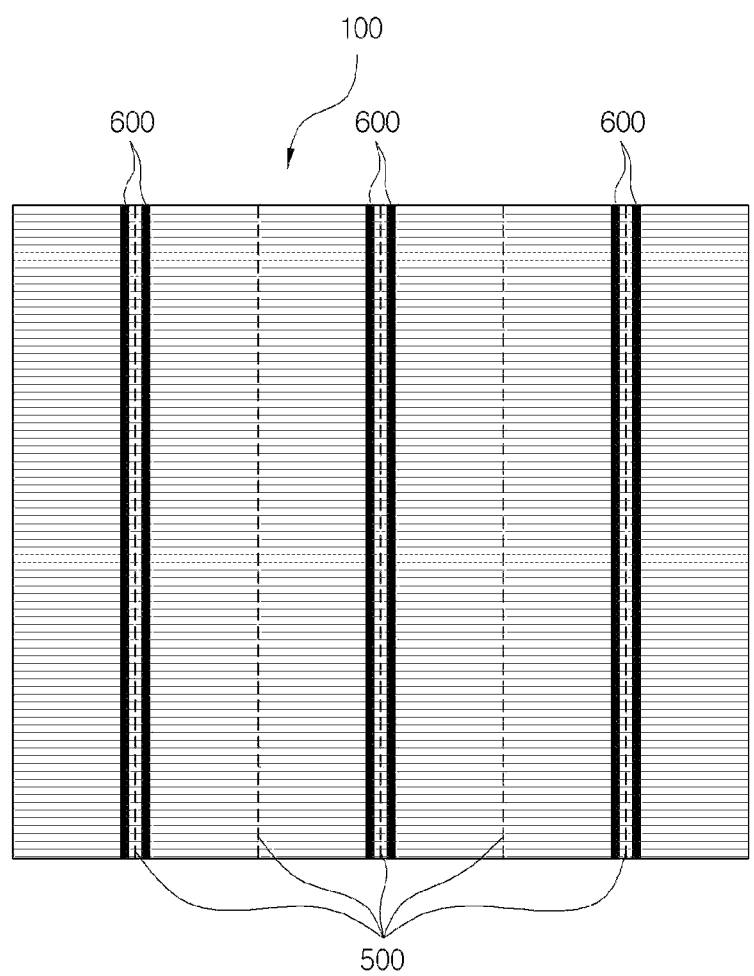
FIG. 27 is a perspective view of the front portion of a wafer for manufacturing a shingled solar cell panel according to Example 8 of the present invention.
Figure 28:
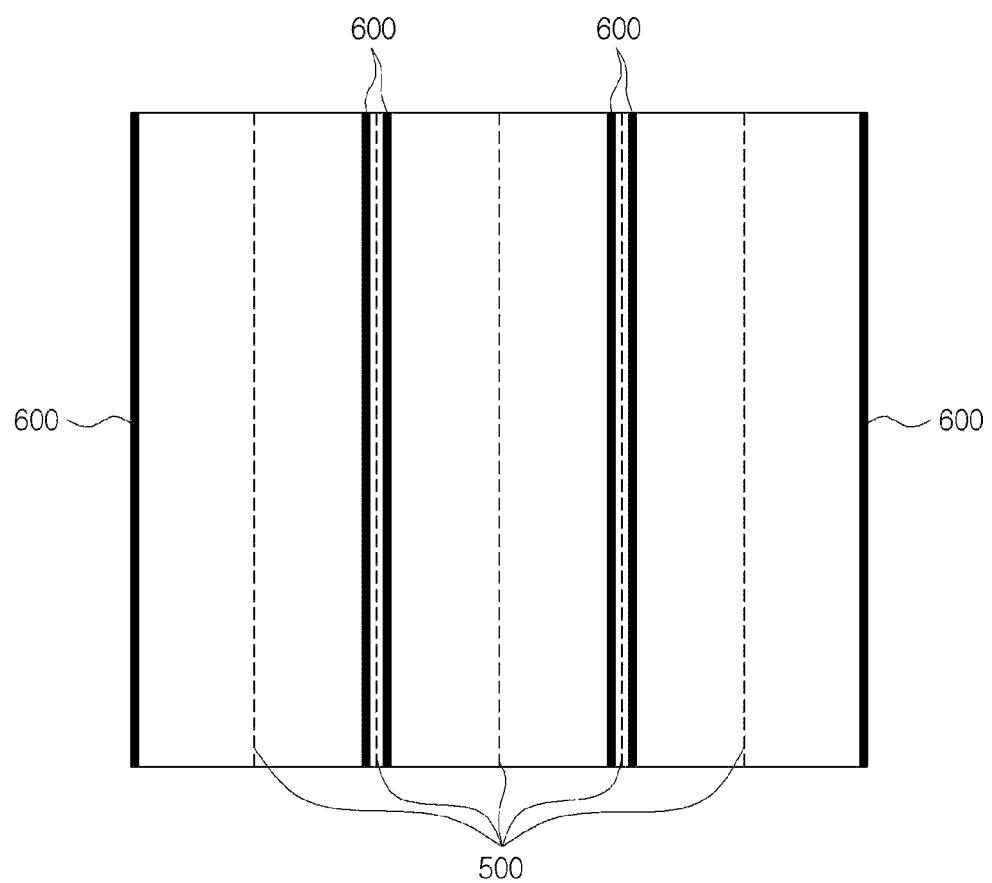
FIG. 28 is a perspective view of the rear portion of the wafer shown in FIG. 27.

FIG. 27 is a perspective view of a front portion of a wafer for manufacturing a shingled solar cell panel according to Example 8 of the present invention, and FIG. 28 is a perspective view of a rear portion of the wafer shown in FIG. 27.

In Example 8 of the present invention, as shown in FIGS. 27 and 28, unlike the wafer of Example 6 in which the four corners have a tapered square shape, the wafer 100 has a full-squared shape.

Also in this Example 8, since the busbars 600 are provided as a pair on both sides adjacent to one cutting line 500, and the edge portions of the wafer 100 are provided to have the same length as the central portion, waste of material for forming the busbars can be prevented compared to Example 7, and since the edge portion of both left and right sides of the wafer 100 can be used in the same manner as the central portion, the manufacturing efficiency of the solar cell panel can be improved compared to Example 5.

Example 9

Next, the manufacturing of the shingled solar cell panel according to Example 9 of the present invention will be described with reference to FIGS. 29 and 30. Moreover, in Example 9, the same parts as those in Example 7 are denoted by the same reference numerals, and repeated description thereof is omitted.

Figure 29:
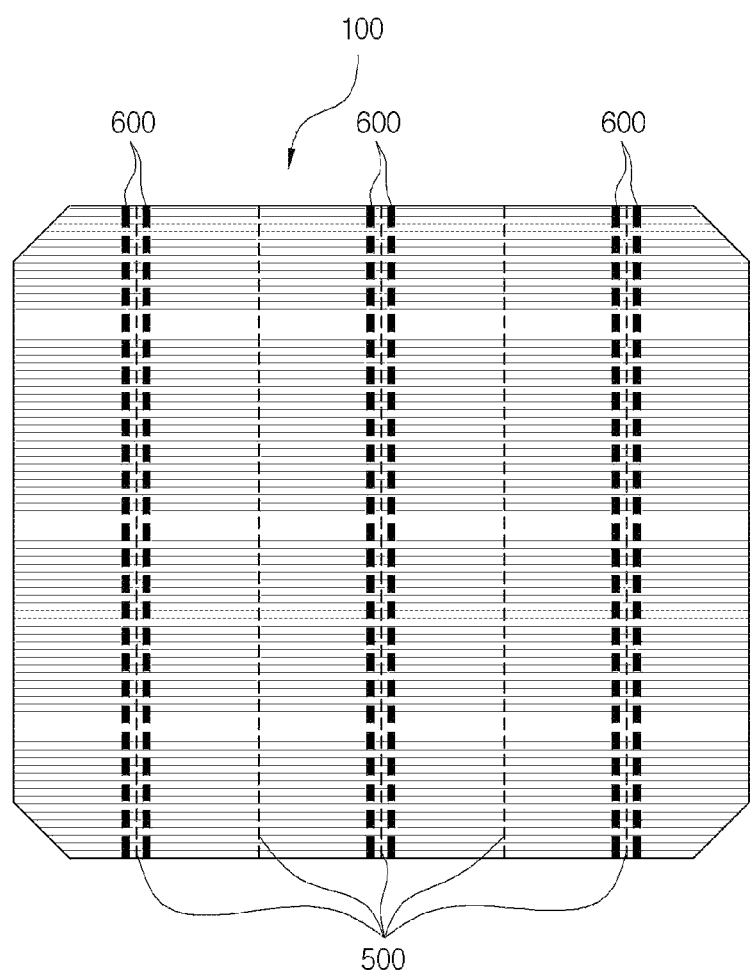
FIG. 29 is a perspective view of the front portion of a wafer for manufacturing a shingled solar cell panel according to Example 9 of the present invention.
Figure 30:
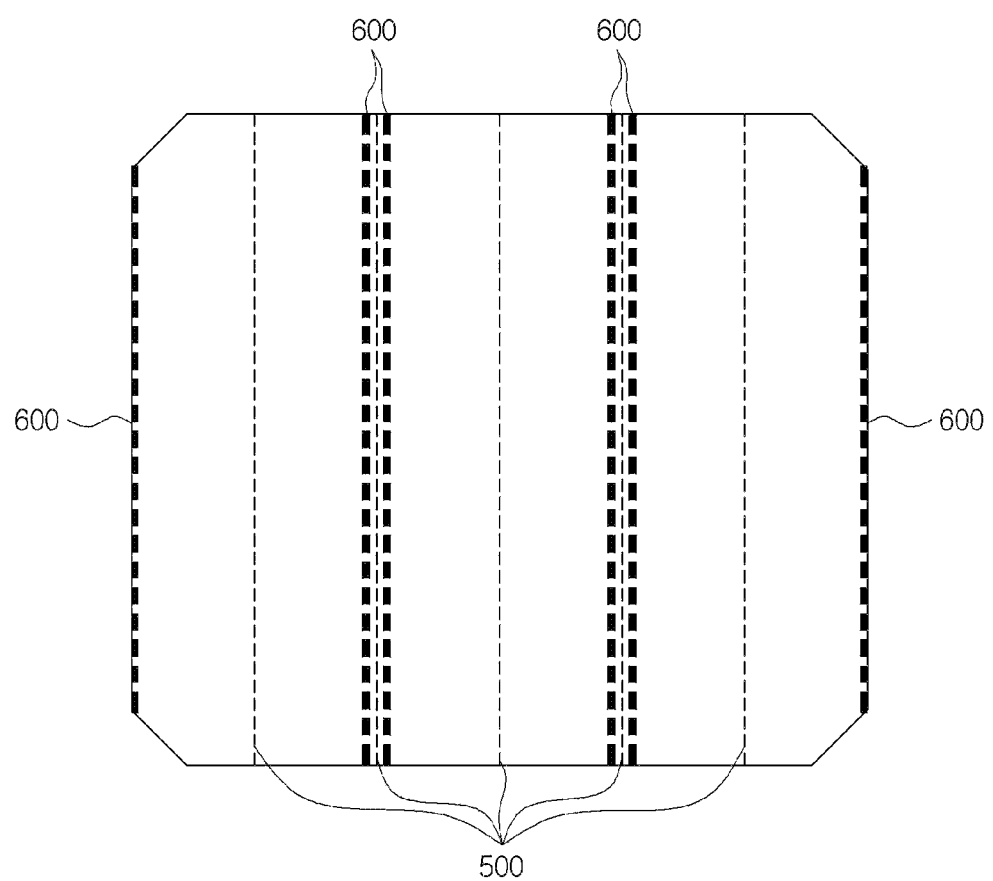
FIG. 30 is a perspective view of the rear portion of the wafer shown in FIG. 29.

FIG. 29 is a perspective view of a front portion of a wafer for manufacturing a shingled solar cell panel according to Example 9 of the present invention, and FIG. 30 is a perspective view of a rear portion of the wafer shown in FIG. 29.

In Example 9 of the present invention, as in Example 7, as a solar cell wafer, the wafer 100 may be made of single crystal or polycrystalline silicon, and the four corners are provided in a tapered pseudo-squared shape, and a busbar 600 is provided as a pair on both sides adjacent to one cutting line 500, and as shown in FIGS. 29 and 30, a plurality of busbars 600 provided on each of front and rear portions of the wafer 100 are formed in a dot shape.

In Example 9, since the plurality of busbars 600 are formed in a dot shape, the amount of paste for forming the busbars can be reduced by about 50% compared to Example 7.

Example 10

Next, the manufacturing of the shingled solar cell panel according to Example 10 of the present invention will be described with reference to FIGS. 31 and 32. Moreover, in Example 10, the same parts as those in Example 8 are denoted by the same reference numerals, and repeated description thereof is omitted.

Figure 31:
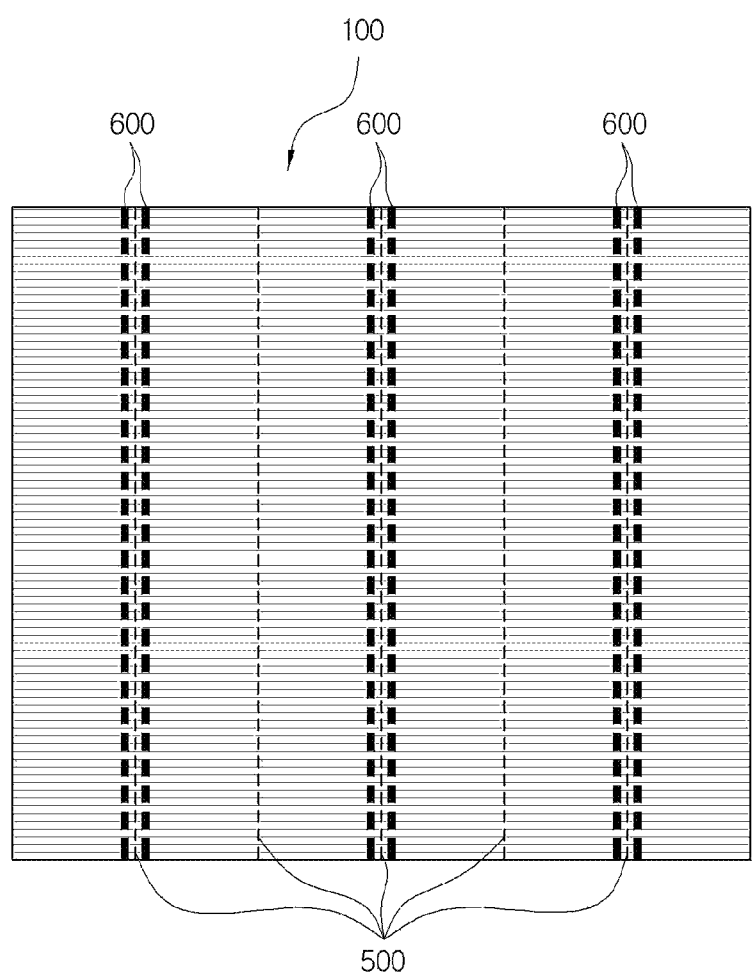
FIG. 31 is a perspective view of the front portion of a wafer for manufacturing a shingled solar cell panel according to Example 10 of the present invention.
Figure 32:
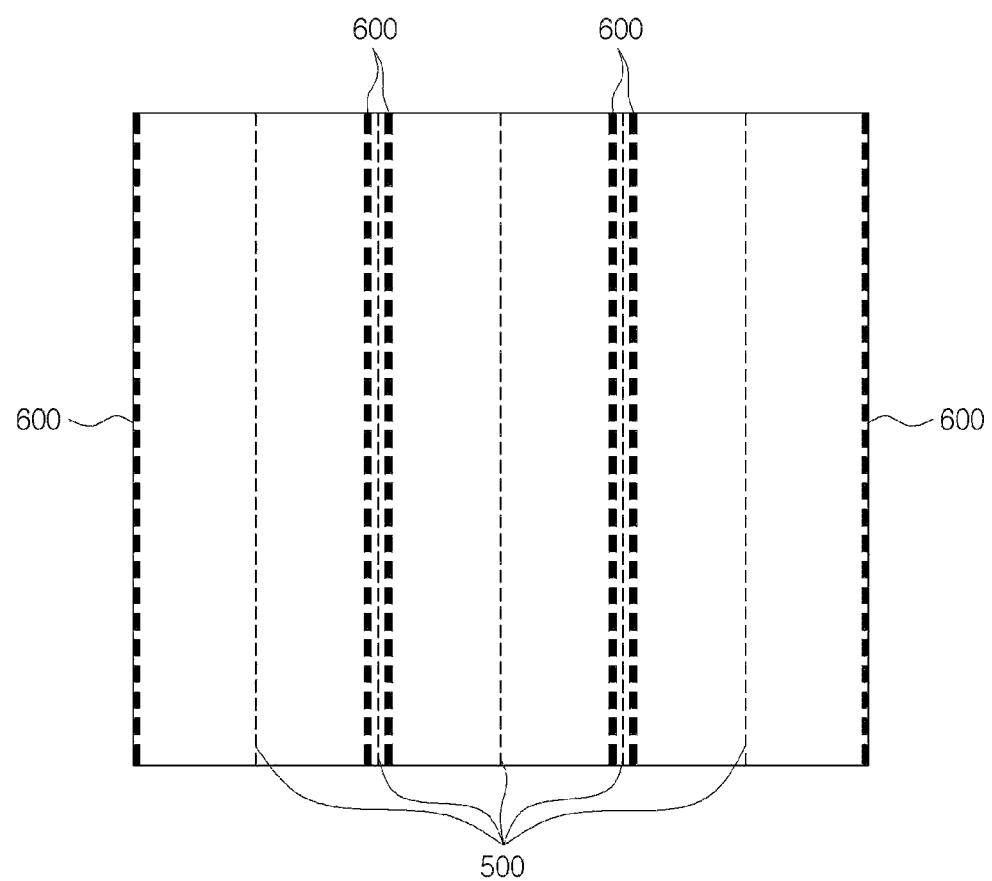
FIG. 32 is a perspective view of the rear portion of the wafer shown in FIG. 31.

FIG. 31 is a perspective view of a front portion of a wafer for manufacturing a shingled solar cell panel according to Example 10 of the present invention, and FIG. 32 is a perspective view of a rear portion of the wafer shown in FIG. 31.

In Example 10 of the present invention, as in Example 8, the wafer 100 is formed in a full-squared shape as shown in FIGS. 31 and 32, and a busbar 600 is provided as a pair on both sides adjacent to one cutting line 500, and a plurality of busbars 600 provided on each of front and rear portions of the wafer 100 are formed in a dot shape.

In Example 10, since the plurality of busbars 600 are formed in a dot shape, the amount of paste for forming the busbars can be reduced by about 50% compared to Example 8.

Although the invention made by the present inventors has been described in detail according to the above embodiments, the present invention is not limited to the above embodiments and various modifications can be made without departing from the gist of the present invention.

INDUSTRIAL APPLICABILITY

A shingled solar cell panel can be inexpensively prepared by using the shingled solar cell panel and method of manufacturing the same according to the present invention.

The invention claimed is:
1. A method of manufacturing a shingled solar cell panel, comprising:
 (a) providing a wafer made of a heterojunction with intrinsic thin layer (HIT) in which a plurality of conductive layers are formed on upper and lower portions, respectively;
 (b) forming a plurality of adhesive layers by applying a conductive adhesive on the upper conductive layer;

(c) dividing the wafer on which the adhesive layers are formed into a plurality of strips, wherein the number of adhesive layers is N−1 (where N is the number of strips), and
(d) forming a string by overlapping a lower conductive layer of an i-th strip on an area of an (i−1)-th strip where a corresponding one of the adhesive layers is provided among the divided strips, wherein i is an integer from 2 to N,
wherein each of the upper and lower conductive layers of the plurality of strips is electrically bonded via only the adhesive layer,
wherein, in the step (c) performed after the step (a), the plurality of strips are divided and provided by a scribing process with a laser at the upper and lower portions of the wafer, a plurality of first grooves are formed in the upper portion of the wafer to a depth of less than 60% of the wafer thickness by scribing of the laser, and a plurality of second grooves are formed in the lower portion of the wafer to a depth of less than 40% of the wafer thickness, and
wherein each of the adhesive layers is used as a reference for guiding a movement direction of the laser in the scribing process.

2. The method of claim 1, wherein the application of the conductive adhesive in step (b) is performed by a screen printing method.

3. The method of claim 1, wherein in the step (c), the plurality of strips are divided and provided by scribing with the laser at the upper and lower portions of the wafer along one side of each of the adhesive layers.

4. The method of claim 3, wherein the plurality of strips are provided by mechanical division from the upper portion to the lower portion.

5. The method of claim 1, further comprising applying a conductive adhesive to the edge portion of the strip divided in step (c).

6. A shingled solar cell panel manufactured by the method of manufacturing a shingled solar cell panel of claim 1.

7. A method of manufacturing a shingled solar cell panel, comprising:
(a) providing a plurality of solar cells in which a plurality of strips partially overlap each other to form one string;
(b) providing a plurality of wire sheets in which a plurality of wires are respectively disposed;
(c) mounting first and second wire sheets as some of the plurality of wire sheets on upper surfaces of first and the third strings as some of the plurality of solar cells;
(d) mounting a second string as one of the plurality of solar cells on the first and second wire sheets;
(e) electrically connecting the first string, the second string and the third string to each other by a plurality of wires respectively provided on the first and the second wire sheets, and
(f) fixing a plurality of wires respectively provided on the first and the second wire sheets to the solar cell,
wherein the first string, the second string, and the third string are disposed at predetermined intervals,
wherein, in the step (c), a portion of a first wire protruding from the first wire sheet to the left of the first wire sheet is positioned on an upper surface of the first string to electrically connect the first wire sheet and the first string, and a portion of a second wire protruding from the second wire sheet to the right of the second wire sheet is positioned on an upper surface of the third string to electrically connect the second wire sheet and the third string, and wherein, in the step (d), a portion of the first wire protruding from the first wire sheet to the right of the first wire sheet is positioned on a lower surface of the second string, and a portion of the second wire protruding from the second wire sheet to the left of the second wire sheet is positioned on the lower surface of the second string.

8. The method of claim 7, wherein both ends of the plurality of wires are disposed to protrude from the wire sheet,
the wire sheet is made of an EVA film or a POF film, and
the plurality of wires are fixed on the wire sheet by thermo-compressing the wire sheet.

9. The method of claim 8, wherein each of the wires is made of a core and a coating material for coating the core, and
the core is made of Cu, and the coating material is made of In/Sn, Bi/Sn, or pure Sn.

10. The method of claim 9, wherein the diameter of the wire is 250 to 350 μm, and
the wire is embedded in a polymer, and when heat is applied, the wire is exposed in a process of melting the polymer to form an electrical bond between the strings.

11. The method of claim 8, wherein the plurality of wires are disposed at uniform intervals on the wire sheet or disposed close to a connection portion with a string.

12. The method of claim 7, wherein the fixing of the plurality of wires in step (f) comprises providing an EVA film at a lower portion of a string and an adjacent string, and pressing the EVA film to fix the plurality of wires.

13. The method of claim 7, wherein the interval between the strings is 0.5 to 1 mm.

14. A method of manufacturing a shingled solar cell panel, comprising:
(a) providing a wafer for a solar cell;
(b) providing a plurality of cutting lines on front and rear portions of the wafer, respectively;
(c) providing a plurality of busbars respectively on the front and rear portions of the wafer; and
(d) providing a plurality of solar cells by cutting the wafer along the plurality of cutting lines;
the busbars are provided as a pair on both sides adjacent to the one cutting line,
wherein the plurality of cutting lines provided on the front and rear portions have a constant interval and are respectively provided as a first cutting line, a second cutting line, a third cutting line, and a fourth cutting line,
wherein the busbars provided on the front portion are provided on one edge portion, both sides of the second cutting line and both sides of the fourth cutting line,
wherein the busbars provided on the rear portion are provided on both sides of the first cutting line, both sides of the third cutting line, and the other edge portion, and
wherein the first, second, third, and fourth cutting lines each extend in a first direction and are arranged in a second direction orthogonal to the first direction, the second cutting line disposed farther from the one edge portion than the first cutting line in the second direction, the third cutting line disposed farther from the one edge portion than the second cutting line in the second direction, the fourth cutting line disposed farther from the one edge portion than the third cutting line in the second direction.

15. The method of claim 14, wherein the busbar has a dot shape.

16. The method of claim 14, wherein the width of the busbar is 1.1 to 1.4 mm, and
- a pair of busbars provided on both sides adjacent to the one cutting line are formed at an interval of 270 to 350 µm.

17. The method of claim 14, wherein the solar cell is formed of any one of p-passivated emitter and rearside contact (p-PERC), n-heterojunction with intrinsic thin layer (n-HIT), n-passivated emitter and rear totally diffused (n-PERT), and charge selective contact (CSC).

18. The method of claim 3, wherein the one side of each of the adhesive layers is aligned with a corresponding one of the first grooves.

19. The method of claim 3, wherein the one side of each of the adhesive layers is aligned with a corresponding one of the first grooves and a corresponding one of the second grooves.

* * * * *